(12) United States Patent
Kalish et al.

(10) Patent No.: US 11,450,744 B2
(45) Date of Patent: Sep. 20, 2022

(54) TRANSITION-METAL OXIDES-COATED HYDROGEN-TERMINATED DIAMOND SURFACE AND USES THEREOF

(71) Applicant: Technion Research & Development Foundation Ltd., Technion (IL)

(72) Inventors: Rafi Kalish, Haifa (IL); Moshe Tordjman, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 228 days.

(21) Appl. No.: 16/644,015

(22) PCT Filed: Sep. 2, 2018

(86) PCT No.: PCT/IL2018/050971
§ 371 (c)(1),
(2) Date: Mar. 3, 2020

(87) PCT Pub. No.: WO2019/043715
PCT Pub. Date: Mar. 7, 2019

(65) Prior Publication Data
US 2020/0403067 A1 Dec. 24, 2020

Related U.S. Application Data

(60) Provisional application No. 62/553,871, filed on Sep. 3, 2017.

(51) Int. Cl.
*H01L 29/16* (2006.01)
*H01B 1/04* (2006.01)
(Continued)

(52) U.S. Cl.
CPC .......... *H01L 29/1602* (2013.01); *C01B 32/25* (2017.08); *H01B 1/04* (2013.01);
(Continued)

(58) Field of Classification Search
CPC .......... H01B 1/04; C30B 29/04; C01B 32/25; C01B 32/28; H01L 29/1602; H01L 29/1607
See application file for complete search history.

(56) References Cited

U.S. PATENT DOCUMENTS 6,091,186 A * 7/2000 Cao .......................... H01J 1/30
257/11
6,152,977 A * 11/2000 D'Evelyn ........... C23C 14/5846
51/293

(Continued)

OTHER PUBLICATIONS

Crawford et al "Surface transfer doping of diamond: A review", Progress in Surface Science 96 (2021) 100613.*

(Continued)

*Primary Examiner* — Mark Kopec
(74) *Attorney, Agent, or Firm* — Knobbe, Martens, Olson & Bear, LLP

(57) ABSTRACT

The present invention provides a conducting material comprising a carbon-based material selected from a diamond or an insulating diamond-like carbon, having a hydrogen-terminated surface and a layer of tungsten trioxide, rhenium trioxide, or chromium oxide coating said hydrogen-terminated surface. Such conducting materials are useful in the fabrication of electronic components, electrodes, sensors, diodes, field effect transistors, and field emission electron sources.

16 Claims, 13 Drawing Sheets

(51) Int. Cl.
*H01B 1/08* (2006.01)
*H01J 37/073* (2006.01)
*H01L 29/167* (2006.01)
*H01L 29/778* (2006.01)
*H01L 29/872* (2006.01)
*C01B 32/25* (2017.01)

(52) U.S. Cl.
CPC .............. *H01B 1/08* (2013.01); *H01J 37/073* (2013.01); *H01L 29/167* (2013.01); *H01L 29/7786* (2013.01); *H01L 29/872* (2013.01)

(56) References Cited

U.S. PATENT DOCUMENTS

| | | | |
|---|---|---|---|
| 9,117,737 B2* | 8/2015 | Kalish | H01L 21/0435 |
| 2008/0187769 A1 | 8/2008 | Huzinec et al. | |
| 2011/0175038 A1* | 7/2011 | Hou | H01J 9/025 |
| | | | 252/502 |
| 2013/0336873 A1 | 12/2013 | Ishiwata et al. | |
| 2014/0319542 A1 | 10/2014 | Kalish et al. | |
| 2016/0307747 A1 | 10/2016 | Shestopalov et al. | |

OTHER PUBLICATIONS

Crawford et al "Enhanced surface transfer doping of diamond by V2O5 with improved thermal stability", Appl. Phys. Lett. 108, 042103 (2016).*

Vernoa et al "Comparative investigation of surface transfer doping of hydrogen terminated diamond by high electron affinity insulators", J. Appl. Phys. 120, 025104 (2016).*

Tordjman et al "Boosting surface charge-transfer doping efficiency and robustness of diamond with WO3 and ReO3", Appl. Phys. Lett. 111, 111601 (2017).*

Crawford et al; "Enhanced surface transfer doping of diamond by V2O5 with improved thermal stability" Applied Physics Letters 108(4) 042103 .(2016).

Gerling et al; "Characterization of Transition Metal Oxide/Silicon Heterojunctions for Solar Cell Applications" Applied Sciences 5(4), pp. 695-705. (2015).

Greiner et al; "Transition Metal Oxide Work Functions: The Influence of Cation Oxidation State and Oxygen Vacancies" Advanced Functional Materials 22(21), pp. 4557-4568.(2012).

Irfan et al; "Work function recovery of air exposed molybdenum oxide thin films" Applied Physics Letters 101(9), 093305. (2012).

Suchitra et al; "High tunability of the work function of (001) surface of ReO3 with O-vacancies: First principles analysis" 116(3), 034304 .(2014).

Russell et al; "High tunability of the work function of (001) surface of ReO3 with O-vacancies: First principles analysis" Applied Physics Letters 103, 202112. (2013).

Tordjman et al; "Superior Surface Transfer Doping Diamond with MoO3" Advanced Materials Interfaces 1, 1300155 . (2014).

Vardi et al; "A Diamond:H/MoO3 MOSFET" IEEE Electron Device Lett., 35(12), pp. 1320-1322. (2014).

Yoo et al; "Formation of perfect ohmic contact at indiumtinoxide/ N,N9-di(naphthalene-1-yl)N,N9-diphenyl-benzidine interface using ReO3" Scientific Reports4, 3902 (2014).

International Search Report and Written Opinion for Application No. PCT/IL18/50971, dated Jan. 16, 2019 in 10 pages.

* cited by examiner

US 11,450,744 B2

TRANSITION-METAL OXIDES-COATED HYDROGEN-TERMINATED DIAMOND SURFACE AND USES THEREOF

CROSS REFERENCE TO RELATED APPLICATIONS

This application is the U.S. National Phase under 35 U.S.C. § 371 of International Application No. PCT/IL2018/050971 filed Sep. 2, 2018, designating the U.S. and published as WO 2019/043715 on Mar. 7, 2019 which claims the benefit of U.S. Provisional Patent Application No. 62/553,871 filed Sep. 3, 2017. Any and all applications for which a foreign or domestic priority claim is identified above and/or in the Application Data Sheet as filed with the present application are hereby incorporated by reference under 37 CFR 1.57.

TECHNICAL FIELD

The present invention relates to a conductive diamond surface, more particularly to tungsten trioxide ($WO_3$), rhenium trioxide ($ReO_3$), or chromium oxide ($CrO_3$)-coated hydrogen-terminated diamond surface showing thermal stability with superior sheet conductivity and hole carrier concentration, and to uses thereof.

BACKGROUND ART

The next-generation of outperforming electronic devices is predicted to be led by diamond implementation as extreme semiconductors, as they have the most favorable properties among other semiconductors for this task (i.e., highest breakdown field and thermal conductivity, dielectric constant, and carrier transport properties). Up to date, due to the lack of suitable bulk dopants (acceptors and donors) with low activation energies (Kalish, 2007), diamond free carriers are found only at the surface and are generated by an unique sub-surface two-dimensional hole gas (2DHG) (Strobel et al., 2004; Chakrapani et al., 2007). This 2DHG is formed by an upward band bending (BB), following electron charge transfer from a hydrogen-terminated diamond (diamond:H) valence band maximum (VBM) to a lower unoccupied state of a surface electron acceptor (i.e., >4.2 eV from vacuum level). This induced p-type surface conductivity has first been seen in air-exposed hydrogen-terminated diamond (Landstrass and Ravi, 1989) and has been modeled by an electrochemical charge-exchange at the interface called transfer doping (TD) (Maier et al., 2000).

This elementary air-exposed surface TD has opened-up initial realization of diamond-based electronic devices (Umezawa et al., 1999; Taniuchi et al., 2001; Kasu et al., 2005; Kasu et al., 2007), nanoscale planar doped electronic devices (Sussmann, 2009; Geisler and Hugel, 2010), electrochemical electrodes (Poh et al., 2004; Christiaens et al., 2006), and biological electrodes sensors (Yang et al., 2002; Lud et al., 2006; Dankerl et al., 2011), to name just a few. In light of this wide spectrum of promising applications, a lot of efforts are invested for recognizing new surface electron acceptors with ability to surpass existing fragile surface TD of diamond:H. Among all the exposed surface acceptor candidates studied so far, none have yet offered a satisfactory and robust solution for assuring sustainability and efficiency of the diamond surface conductivity as they are required for practical electronic device processing and reliability.

First attempts to improve aqueous (i.e., $H_2O$) air-exposed diamond:H conductivity performances (Sauerer et al., 2001) involved the use of alternative adsorbate molecules with high electron affinity (Strobel et al., 2006; Qi et al., 2007). Nevertheless, all those proposed surface electron acceptor molecules were still suffering from instability to temperature fluctuations, resulting in loss of conductivity upon heating (Laikhtman et al., 2004). Thus, the critical need to find more stable and efficient surface acceptor substitutes.

A second approach proposes to encapsulate the above fragile surface acceptors with thick oxide layers (i.e., $Al_2O_3$) in order to protect the first active electron acceptor adsorbates on the diamond:H surface (i.e., induced by air) (Kawarada, 2014; Daicho et al., 2014). It has been further developed by using thick capsuling oxide layers (100 nm) with high work functions (e.g., $Nb_2O_5$, $WO_3$, $V_2O_5$, $MoO_3$ vs. $Al_2O_3$) in order to exploit them as additional active layers over the air-doped diamond:H surface (Verona et al., 2016). A recent AlN capping layer work has achieved a hole carrier concentration value of $1 \times 10^{14}$ cm$^{-2}$ using $H_2+NH_3$ (Imura et al., 2017) activation of diamond:H, and comparable values from $8.2 \times 10^{13}$ cm$^{-2}$ to $1.7 \times 10^{14}$ cm$^{-2}$ have been reported for a $NO_2$ activation (Wade et al., 2017; Sato and Kasu, 2013). However, despite the ameliorations, all the above approaches have considerable limitation such as in the design, process, and architecture of diamond:H-based electronic devices because the resulting 2DHG conductive channel must be protected with an additional impeding capsulation layer.

Recent advances were reported in the surface TD of diamond:H, using uniquely transition-metal oxides with high work functions as direct exposed surface electron acceptors (without capping), such as $MoO_3$ ($\varphi=5.6$-$6.8$ eV) and $V_2O_5$ ($\varphi=7$ eV) (Russell et al., 2013; Tordjman et al., 2014; Crawford et al., 2016). In these cases, diamond:H/$MoO_3$ (Tordjman et al., 2014) demonstrated a hole carrier concentration up to $1 \times 10^{14}$ cm$^{-2}$, and diamond:H/$V_2O_5$ (Tordjman et al., 2014) displayed values comparable to those of air-exposed diamond:H (Sauerer et al., 2001) (e.g., $1.8 \times 10^{13}$ cm$^{-2}$) but with a thermal stability of up to 300° C. In both cases, oxygen deficiency upon exposure to air is critical and degrades their original efficient work function (Irfan et al., 2012; Greiner et al., 2012). Consequently, the first active monolayer has to be buried with additional protecting layers (e.g. 50 Å for $MoO_3$ and 100 Å for $V_2O_5$) in order to overcome this lacunae. Hence, the crucial need is to find alternative candidates with higher efficiency and thermal stability at the very first monolayer of coverage. Such a desirable case will ensure the close proximity of electrical top-contacts to the sub-surface 2DHG conductive channel (rich in carrier concentration) and will cancel the need for additional encumbering protective layers.

SUMMARY OF INVENTION

In one aspect, the present invention provides a conducting material comprising a carbon-based material selected from a diamond or insulating diamond-like carbon, having a hydrogen-terminated surface and a layer of tungsten trioxide ($WO_3$), rhenium trioxide ($ReO_3$), or chromium oxide ($CrO_3$) coating said hydrogen-terminated surface.

In another aspect, the present invention relates to an electronic component comprising a conducting material as defined above, i.e., a conducting material comprising a carbon-based material having a hydrogen-terminated surface and a layer of $WO_3$, $ReO_3$, or $CrO_3$ coating said hydrogen-terminated surface.

In still another aspect, the present invention relates to an electrode comprising a conducting material as defined above, i.e., a conducting material comprising a carbon-based material having a hydrogen-terminated surface and a layer of $WO_3$, $ReO_3$, or $CrO_3$ coating said hydrogen-terminated surface.

In yet another aspect, the present invention relates to a sensor comprising a conducting material as defined above, i.e., a conducting material comprising a carbon-based material having a hydrogen-terminated surface and a layer of $WO_3$, $ReO_3$, or $CrO_3$ coating said hydrogen-terminated surface. Such sensors can be used for detecting chemical and biological materials. In still other aspects, the present invention thus relates to the use of such a sensor for the detection of a chemical or biological material; and to a method for the detection of a chemical or biological material utilizing said sensor.

In another aspect, the present invention relates to a diode comprising a conducting material as defined above, i.e., a conducting material comprising a carbon-based material having a hydrogen-terminated surface and a layer of $WO_3$, $ReO_3$, or $CrO_3$ coating said hydrogen-terminated surface.

In still another aspect, the present invention relates to a FET comprising a conducting material as defined above, i.e., a conducting material comprising a carbon-based material having a hydrogen-terminated surface and a layer of $WO_3$, $ReO_3$, or $CrO_3$ coating said hydrogen-terminated surface.

In yet another aspect, the present invention relates to a field emission electron source, e.g., a field emission cold cathode, comprising a conducting material as defined above, i.e., a conducting material comprising a carbon-based material having a hydrogen-terminated surface and a layer of $WO_3$, $ReO_3$, or $CrO_3$ coating said hydrogen-terminated surface.

DETAILED DESCRIPTION

Figure 1:
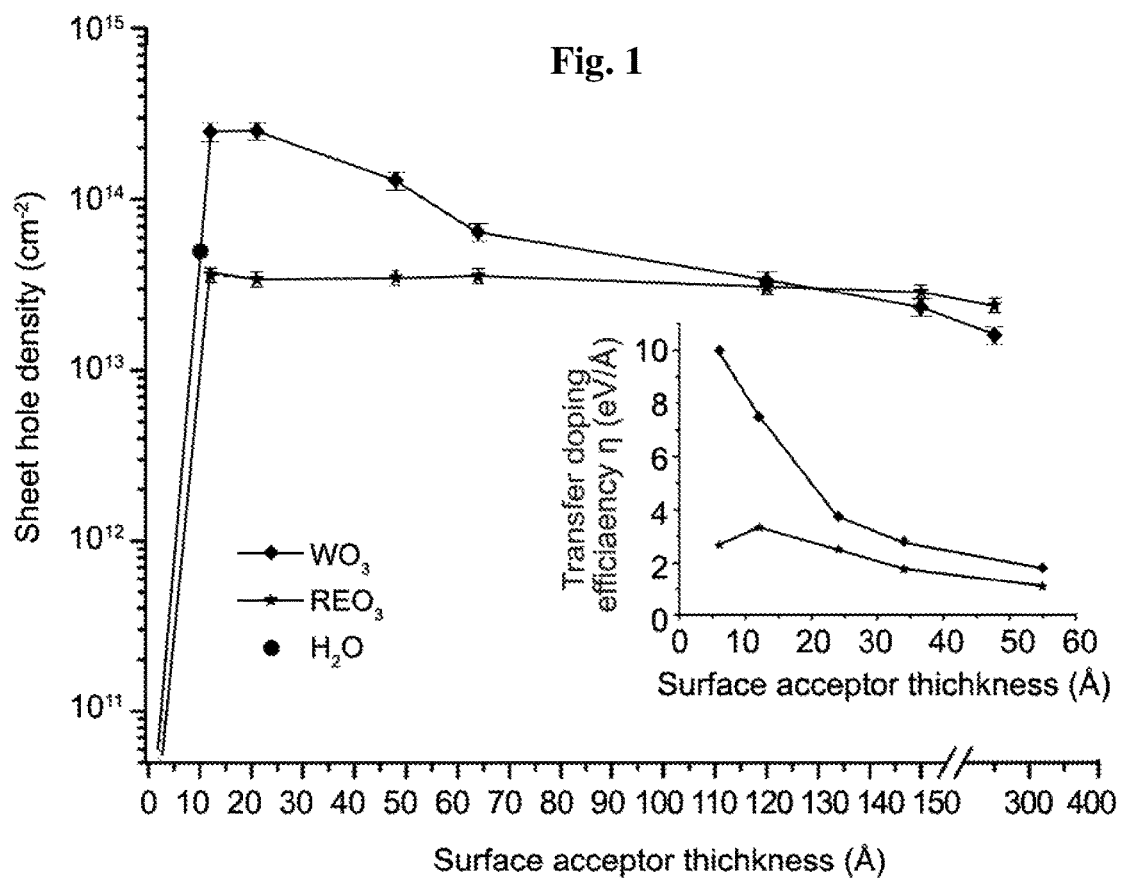
FIG. 1 shows sheet hole carrier concentration as measured (under identical conditions) by Hall effect of transfer doped hydrogen terminated diamond with $ReO_3$ and $WO_3$, as a function of incremental surface acceptor thickness coverage, and $H_2O$-air-exposed (sphere) result presented as reference. (Inset) Transfer doping efficiency vs. surface acceptor thickness at close diamond interface proximity for each respective transition-metal oxide.

It has now been found, in accordance with the present invention, that an advanced charge-transfer yield is demonstrated by employing single monolayers of the transition-metal oxides $WO_3$ and $ReO_3$ deposited on hydrogenated diamond surface, resulting in improved p-type sheet conductivity and thermal stability. Surface conductivities, as determined by Hall effect measurements as function of temperature for $WO_3$ yield a record sheet hole carrier concentration value up to $2.52 \times 10^{14}$ cm$^{-2}$ at room temperature for only few monolayers of coverage. Transfer doping with $ReO_3$ exhibits a consistent narrow sheet carrier concentration range value of around $3 \times 10^{13}$ cm$^{-2}$, exhibiting thermal stability up to 450° C. These enhanced conductivity and temperature robustness exceed those reported for previous exposed surface electron acceptor materials used so far on diamond surface. X-ray photoelectron spectroscopy (XPS) measurements of the C1s core level shift as function of $WO_3$ and $ReO_3$ layer thicknesses are used to determine the respective increase in surface band bending of the accumulation layers, leading to a different sub-surface two-dimensional hole gas formation efficiency in both cases. This substantial difference in charge-exchange efficiency is unexpected since both surface acceptors have very close work functions values. Transfer doping with $WO_3$ reveals the highest yet reported transfer doping efficiency per minimal surface acceptor coverage. This improved surface conductivity performance and thermal stability will promote the realization of 2D diamond-based electronic devices facing process fabrication challenges.

In one aspect, the present invention thus provides a conducting material comprising a carbon-based material selected from a diamond or insulating diamond-like carbon, having a hydrogen-terminated surface and a layer of tungsten trioxide ($WO_3$), rhenium trioxide ($ReO_3$), or chromium oxide ($CrO_3$) coating said hydrogen-terminated surface.

The term "diamond" refers to a carbon-based material which is almost always found in the crystalline form with a purely cubic orientation of sp3 bonded carbon atoms, i.e., to a carbon-based material in which each carbon atom is covalently bonded to four other carbon atoms in a tetrahedron. Particular diamonds include polycrystalline diamonds, nanocrystalline diamonds, ultra-nanocrystalline diamonds, and homoepitaxial single diamonds, each optionally doped by boron, nitrogen, hydrogen, phosphorus, or a combination thereof. In certain embodiments, the diamond is a homoepitaxial single crystal diamond, particularly an undoped homoepitaxial single crystal diamond type IIa.

The term "diamond-like carbon" as used herein refers to an amorphous carbon phase having $sp^3$ hybridized bonds as well as a certain amount of $sp^2$ hybridized bonds, more particularly, a material that has high $sp^3$ hybridized bonds content and displays some of the physical properties of diamond. Diamond-like carbons exist in seven different forms of amorphous carbon materials, all containing significant amounts of $sp^3$ hybridized carbon atoms. The different forms of diamond-like carbons may be produced by mixing the two crystalline polytypes of diamond, i.e., the one having a cubic lattice and the other rare one having a hexagonal lattice, in various ways at the nanoscale level of structure, and these materials may therefore be at the same time amorphous, flexible, and yet purely $sp^3$ bonded "diamond". The hardest, strongest, and slickest mixture is that known as tetrahedral amorphous carbon, or ta-C, considered to be the "pure" form of diamond-like carbon, as it consists of $sp^3$ bonded carbon atoms only. Diamond-like carbons close enough to ta-C on plots of bonding ratios and hydrogen content can be insulators with high values of resistivity. The term "insulating diamond-like carbon" as used herein thus refers to a diamond-like carbon having about 50% or more, e.g., about 50%, 55%, 60%, 65%, 70% 75%, 80%, 85%, 90%, 95% or more, $sp^3$ hybridized bonds. It should be noted that where particular values are described in the description and claims, unless otherwise stated, the term "about" means that an acceptable error range, e.g., up to 5% or 10%, for the particular value should be assumed.

In a particular such aspect, the present invention provides a conducting material comprising a diamond having a hydrogen-terminated surface and a layer of $WO_3$, $ReO_3$, or $CrO_3$ coating said surface, wherein said diamond may be a polycrystalline diamond, nanocrystalline diamond, ultra-nanocrystalline diamond, or homoepitaxial single diamond, undoped or doped by boron, nitrogen, hydrogen, phosphorus, or a combination thereof, e.g., an undoped homoepitaxial single crystal diamond type IIa.

In certain embodiments, the $WO_3$, $ReO_3$ or $CrO_3$ layer coating the hydrogen-terminated surface of the carbon-based material is a single-layer or a multi-layer of said oxide having a thickness in a range of 5 Å to 1000 Å, 5 Å to 900 Å, 5 Å to 800 Å, 5 Å to 700 Å, 5 Å to 600 Å, 5 Å to 500 Å, 5 Å to 450 Å, 5 Å to 400 Å, 5 Å to 350 Å, 5 Å to 300 Å, 5 Å to 250 Å, 5 Å to 200 Å, 5 Å to 150 Å, or 5 Å to 100 Å.

In some embodiments, the conducting material of the invention comprises a carbon-based material selected from a diamond or insulating diamond-like carbon, having a hydrogen-terminated surface and a layer of $WO_3$ coating said hydrogen-terminated surface. In particular such embodiments, said $WO_3$ layer is a single- or multi-layer of $WO_3$ having a thickness in a range of 5 Å to 1000 Å, 5 Å to 900 Å, 5 Å to 800 Å, 5 Å to 700 Å, 5 Å to 600 Å, 5 Å to 500 Å, 5 Å to 450 Å, 5 Å to 400 Å, 5 Å to 350 Å, 5 Å to 300 Å, 5 Å to 250 Å, 5 Å to 200 Å, 5 Å to 150 Å, or 5 Å to 100 Å. Preferred such embodiments are those wherein said $WO_3$ layer has a thickness in the range of 5 Å to 150 Å, or 5 Å to 100 Å.

In other embodiments, the invention provides a conducting material comprising a carbon-based material selected from a diamond or insulating diamond-like carbon, having a hydrogen-terminated surface and a layer of $ReO_3$ coating said hydrogen-terminated surface. In particular such embodiments, said $ReO_3$ layer is a single- or multi-layer of $ReO_3$ having a thickness in a range of 5 Å to 1000 Å, 5 Å to 900 Å, 5 Å to 800 Å, 5 Å to 700 Å, 5 Å to 600 Å, 5 Å to 500 Å, 5 Å to 450 Å, 5 Å to 400 Å, 5 Å to 350 Å, 5 Å to 300 Å, 5 Å to 250 Å, 5 Å to 200 Å, 5 Å to 150 Å, or 5 Å to 100 Å. Preferred embodiments are those wherein said $ReO_3$ layer has a thickness in the range of 5 Å to 150 Å, or 5 Å to 100 Å.

In further embodiments, the invention provides a conducting material comprising a carbon-based material selected from a diamond or insulating diamond-like carbon, having a hydrogen-terminated surface and a layer of $CrO_3$ coating said hydrogen-terminated surface. In particular such embodiments, said $CrO_3$ layer is a single- or multi-layer of $CrO_3$ having a thickness in a range of 5 Å to 1000 Å, 5 Å to 900 Å, 5 Å to 800 Å, 5 Å to 700 Å, 5 Å to 600 Å, 5 Å to 500 Å, 5 Å to 450 Å, 5 Å to 400 Å, 5 Å to 350 Å, 5 Å to 300 Å, 5 Å to 250 Å, 5 Å to 200 Å, 5 Å to 150 Å, or 5 Å to 100 Å. Preferred embodiments are those wherein said $CrO_3$ layer has a thickness in the range of 5 Å to 150 Å, or 5 Å to 100 Å.

In certain embodiments, the carbon based material composing the conducting material of the present invention is a diamond, in any one of the forms listed above, and the thickness of the $WO_3$ layer coating the hydrogen-terminated surface of the diamond is in a range of 5 Å to 1000 Å, 5 Å to 900 Å, 5 Å to 800 Å, 5 Å to 700 Å, 5 Å to 600 Å, 5 Å to 500 Å, 5 Å to 450 Å, 5 Å to 400 Å, 5 Å to 350 Å, 5 Å to 300 Å, 5 Å to 250 Å, 5 Å to 200 Å, 5 Å to 150 Å, or 5 Å to 100 Å, but preferably in the range of 5 Å to 150 Å, or 5 Å to 100 Å. As shown herein, such conducting materials have an electrical stability of up to 300° C. In particular such embodiments, the conducting material of the invention has a sheet conductance higher than $1 \times 10^{-5} \Omega^{-1}$, e.g., in a range of $10^{-5} \Omega^{-1}$ to $10^{-2} \Omega^{-1}$; and a hole carrier concentration higher than $1 \times 10^{11}$ $cm^{-2}$, with thickness and temperature dependency, or higher than $10^{13}$ $cm^{-2}$ at room temperature, e.g., in a range of $10^{11}$ $cm^{-2}$ to $3 \times 10^{14}$ $cm^{-2}$.

In certain embodiments, the carbon based material composing the conducting material of the present invention is a diamond, in any one of the forms listed above, and the thickness of the $ReO_3$ layer coating the hydrogen-terminated surface of the diamond is in a range of 5 Å to 1000 Å, 5 Å to 900 Å, 5 Å to 800 Å, 5 Å to 700 Å, 5 Å to 600 Å, 5 Å to 500 Å, 5 Å to 450 Å, 5 Å to 400 Å, 5 Å to 350 Å, 5 Å to 300 Å, 5 Å to 250 Å, 5 Å to 200 Å, 5 Å to 150 Å, or 5 Å to 100 Å, but preferably in the range of 5 Å to 150 Å, or 5 Å to 100 Å. As shown herein, such conducting materials have an electrical stability of up to 450° C. In particular such embodiments, the conducting material of the invention has a sheet conductance higher than $1 \times 10^{-5} \Omega^{-1}$, e.g., in a range of $10^{-5} \Omega^{-1}$ to $10^{-2} \Omega^{-1}$; and a hole carrier concentration higher than $10^{12}$ $cm^{-2}$, with thickness and temperature dependency, or higher than $10^{13}$ $cm^{-2}$ at room temperature, e.g., in a range of $10^{12}$ $cm^{-2}$ to $10^{14}$ $cm^{-2}$.

In certain embodiments, the carbon based material composing the conducting material of the present invention is a diamond, in any one of the forms listed above, and the thickness of the $CrO_3$ layer coating the hydrogen-terminated surface of the diamond is in a range of 5 Å to 1000 Å, 5 Å to 900 Å, 5 Å to 800 Å, 5 Å to 700 Å, 5 Å to 600 Å, 5 Å to 500 Å, 5 Å to 450 Å, 5 Å to 400 Å, 5 Å to 350 Å, 5 Å to 300 Å, 5 Å to 250 Å, 5 Å to 200 Å, 5 Å to 150 Å, or 5 Å to imA, but preferably in the range of 5 Å to 150 Å, or 5 Å to 100 Å. Such conducting materials have an electrical stability of up to 450° C. In particular such embodiments, the conducting material of the invention has a sheet conductance higher than $1 \times 10^{-5} \Omega^{-1}$, e.g., in a range of $10^{-5} \Omega^{-1}$ to $10^{-2} \Omega^{-1}$; and a hole carrier concentration higher than $10^{12}$ $cm^{-2}$, with thickness and temperature dependency, or higher than $10^{13}$ $cm^{-2}$ at room temperature, e.g., in a range of $10^{12}$ $cm^{-2}$ to $10^{14}$ $cm^{-2}$.

In another aspect, the present invention relates to an electronic component comprising a conducting material as defined in any one of the embodiments above, i.e., a conducting material comprising a carbon-based material having a hydrogen-terminated surface and a layer of $WO_3$, $ReO_3$, or $CrO_3$ coating said hydrogen-terminated surface. In certain embodiments, the electronic component of the invention comprises a conducting material wherein the carbon-based material is a diamond in any one of the forms listed above, and the thickness of the oxide layer coating the hydrogen-terminated surface of the diamond is in a range of 5 Å to 1000 Å, but preferably 5 Å to 150 Å, or 5 Å to 100 Å. Particular such electronic components are those wherein said diamond is coated with (i) a $WO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $1 \times 10^{11}$ $cm^{-2}$, e.g., in a range of $10^{11}$ $cm^{-2}$ to $3 \times 10^{14}$ $cm^{-2}$; (ii) a $ReO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $10^{12}$ $cm^{-2}$, e.g., in a range of $10^{12}$ $cm^{-2}$ to $10^{14}$ $cm^{-2}$; or (iii) a $CrO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $10^{12}$ $cm^{-2}$, e.g., in a range of $10^{12}$ $cm^{-2}$ to $10^{14}$ $cm^{-2}$.

In still another aspect, the present invention relates to an electrode comprising a conducting material as defined in any one of the embodiments above, i.e., a conducting material comprising a carbon-based material having a hydrogen-terminated surface and a layer of $WO_3$, $ReO_3$, or $CrO_3$ coating said hydrogen-terminated surface. In certain embodiments, the electrode of the invention comprises a conducting material wherein the carbon-based material is a diamond in any one of the forms listed above, and the thickness of the oxide layer coating the hydrogen-terminated surface of the diamond is in a range of 5 Å to 1000 Å, but preferably 5 Å to 150 Å, or 5 Å to 100 Å. Particular such electrodes are those wherein said diamond is coated with (i) a $WO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $1 \times 10^{11}$ $cm^{-2}$ e.g., in a range of $10^{11}$ $cm^{-2}$ to $3 \times 10^{14}$ $cm^{-2}$; (ii)) a $ReO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $10^{12}$ $cm^{-2}$, e.g., in a range of $10^{12}$ $cm^{-2}$ to $10^{14}$ $cm^{-2}$; or (iii) a $CrO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $10^{12}$ $cm^{-2}$, e.g., in a range of $10^{12}$ $cm^{-2}$ to $10^{14}$ $cm^{-2}$. According to the invention, the electrode may comprise said conducting material as a conductive layer only or, alternatively, may entirely consist of said conducting material.

In yet another aspect, the present invention relates to a sensor comprising a conducting material as defined above, i.e., a conducting material comprising a carbon-based material having a hydrogen-terminated surface and a layer of $WO_3$, $ReO_3$, or $CrO_3$ coating said hydrogen-terminated surface. In certain embodiments, the sensor of the invention comprises a conducting material wherein the carbon-based material is a diamond in any one of the forms listed above, and the thickness of the oxide layer coating the hydrogen-terminated surface of the diamond is in a range of 5 Å to 1000 Å, but preferably 5 Å to 150 Å, or 5 Å to 100 Å. Particular such sensors are those wherein said diamond is coated with (i) a $WO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $1 \times 10^{11}$ $cm^{-2}$, e.g., in a range of $10^{11}$ $cm^{-2}$ to $3 \times 10^{14}$ $cm^{-2}$; (ii) a $ReO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $10^{12}$ $cm^{-2}$, e.g., in a range of $10^{12}$ $cm^{-2}$ to $10^{14}$ $cm^{-2}$; or (iii) a $CrO_3$ layer having a thickness in a range of 5 Å to 1000 Å, wherein said conducting material has a sheet conductance higher than $1 \times 10^{-5} \Omega^{-1}$, e.g., in a range of $10^{-5} \Omega^{-1}$ to $10^{-2} \Omega^{-1}$, and a hole carrier concentration higher than $10^{12}$ $cm^{-2}$, e.g., in a range of $10^{12}$ $cm^{-2}$ to $10^{14}$ $cm^{-2}$.

The sensor of the invention may be used, inter alia, for the detection of chemical or biological materials. In still other aspects, the present invention thus relates to the use of such a sensor for the detection of a chemical or biological material; and to a method for the detection of a chemical or biological material utilizing such a sensor.

A diode is a two-terminal electronic component with an asymmetric transfer characteristic, with low (ideally zero) resistance to current flow in one direction, and high (ideally infinite) resistance in the other. A semiconductor diode, the most common type today, is a crystalline piece of semiconductor material with a p-n junction connected to two electrical terminals. A p-n junction is a boundary or interface between two types of semiconductor material, p-type (a doped semiconductor containing excess holes) and n-type (doped semiconductor containing excess free electrons), inside a single crystal of semiconductor, created by doping, e.g., by ion implantation, diffusion of dopants, or by epitaxy, i.e., growing a layer of crystal doped with one type of dopant on top of a layer of crystal doped with another type of dopant. P-n junctions are elementary "building blocks" of most semiconductor electronic devices such as diodes, transistors, light-emitting diodes (LEDs) and integrated circuits, and are the active sites where the electronic action of the device takes place. Certain electronic devices such as particular types of transistors, e.g., bipolar junction transistors, consist of two pn junctions in series, in the form of npn or pnp jubction or heteroj uncti on.

In another aspect, the present invention relates to a diode comprising a conducting material as defined in any one of the embodiments above, i.e., a conducting material comprising a carbon-based material having a hydrogen-terminated surface and a layer of $WO_3$, $ReO_3$, or $CrO_3$ coating said hydrogen-terminated surface. In certain embodiments, the diode of the invention comprises a conducting material wherein the carbon-based material is a diamond in any one of the forms listed above, and the thickness of the oxide layer coating the hydrogen-terminated surface of the diamond is in a range of 5 Å to 1000 Å, but preferably 5 Å to 150 Å, or 5 Å to 100 Å. Particular such diodes are those wherein said diamond is coated with (i) a $WO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $1\times10^{11}$ cm$^{-2}$, e.g., in a range of $10^{11}$ cm$^{-2}$ to $3\times10^{14}$ cm$^{-2}$; (ii) a $ReO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $10^{12}$ cm$^{-2}$, e.g., in a range of $10^{12}$ cm$^{-2}$ to $10^{14}$ cm$^{-2}$; or (iii) a $CrO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $10^{12}$ cm$^{-2}$, e.g., in a range of $10^{12}$ cm$^{-2}$ to $10^{14}$ cm$^{-2}$.

In certain embodiments, the diode of the invention is a p-n junction diode, a p-n-p heterojunction diode, or n-p-n heterojunction diode, wherein one or more of the p-type layers in said diode comprises said conducting material and/or said conducting material bridges said p-n junction, p-n-p heterojunction or n-p-n heterojunction.

In other embodiments, the diode of the invention is configured as Schottky diode, also known as hot carrier diode, in which a metal-semiconductor rather than a semiconductor-semiconductor junction is formed, creating a Schottky barrier, i.e., as a semiconductor diode with a low forward voltage drop and a very fast switching action.

Field effect transistor (FET) is a unipolar transistor using an electric field to control the shape and hence the conductivity of a channel of one type of charge carrier in a semiconductor material. The device consists of an active channel through which charge carriers, electrons or holes, flow from the source, through which the carriers enter the channel, to the drain, through which the carriers leave the channel, wherein the conductivity of the channel is a function of the potential applied across the gate terminal, i.e., the terminal that modulates the channel conductivity, and source terminal. A FET can be constructed from a number of semiconductors, wherein the channel is doped to produce either an n-type or a p-type semiconductor, and the drain and source are each doped of similar or opposite type to the channel, depending on the mode of the FET.

In still another aspect, the present invention relates to a FET comprising a conducting material as defined in any one of the embodiments above, i.e., a conducting material comprising a carbon-based material having a hydrogen-terminated surface and a layer of $WO_3$, $ReO_3$, or $CrO_3$ coating said hydrogen-terminated surface. In certain embodiments, the FET of the invention comprises a conducting material wherein the carbon-based material is a diamond in any one of the forms listed above, and the thickness of the oxide layer coating the hydrogen-terminated surface of the diamond is in a range of 5 Å to 1000 Å, but preferably 5 Å to 150 Å, or 5 Å to 100 Å. Particular such FETs are those wherein said diamond is coated with (i) a $WO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $1\times10^{11}$ cm$^{-2}$, e.g., in a range of $10^{11}$ cm$^{-2}$ to $3\times10^{14}$ cm$^{-2}$; (ii) a $ReO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $10^{12}$ cm$^{-2}$, e.g., in a range of $10^{12}$ cm$^{-2}$ to $10^{14}$ cm$^{-2}$; or (iii) a $CrO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $10^{12}$ cm$^{-2}$, e.g., in a range of $10^{12}$ cm$^{-2}$ to $10^{14}$ cm$^{-2}$. The FET of the invention may comprise said conducting material as a conducting layer and/or as a p-type layer. In one particular embodiment, the FET of the invention is constructed as a high-frequency high power FET.

Field emission, also known as field electron emission and electron field emission, is emission of electrons induced by an electrostatic field, e.g., from a solid surface such as pure metals into vacuum, air, a fluid, or any non-conducting or weakly conducting dielectric. Field emission is explained by quantum tunneling of electrons, wherein the wave-mechanical tunneling of electrons through a rounded triangular barrier created at the surface of an electron conductor by applying a very high electric field is known as Fowler-Nordheim tunneling. Individual electrons can escape by Fowler-Nordheim tunneling from many materials in different circumstances. Cold field electron emission is a statistical emission regime, in which the electrons in the emitter are initially in internal thermodynamic equilibrium, and most emitted electrons escape by Fowler-Nordheim tunneling from electron states close to the emitter Fermi level, i.e., electrochemical potential.

Cold cathodes are cathodes, i.e., electrodes emitting electrons, which in contrast to hot cathodes, are electrically heated to their operating temperature by methods other than electric current passing through a filament.

In yet another aspect, the present invention relates to a field emission electron source, e.g., a field emission cold cathode, comprising a conducting material as defined in any one of the embodiments above, i.e., a conducting material comprising a carbon-based material having a hydrogen-terminated surface and a layer of $WO_3$, $ReO_3$, or $CrO_3$ coating said hydrogen-terminated surface. In certain embodiments, the field emission electron source of the invention comprises a conducting material wherein the carbon-based material is a diamond in any one of the forms listed above, and the thickness of the oxide layer coating the hydrogen-terminated surface of the diamond is in a range of 5 Å to 1000 Å, but preferably 5 Å to 150 Å, or 5 Å to 100 Å. Particular such field emission electron sources are those wherein said diamond is coated with (i) a $WO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $1\times10^{11}$ cm$^{-2}$, e.g., in a range of $10^{11}$ cm$^{-2}$ to $3\times10^{14}$ cm$^{-2}$; (ii) a $ReO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $10^{12}$ cm$^{-2}$, e.g., in a range of $10^{12}$ cm$^{-2}$ to $10^{14}$ cm$^{-2}$; or (iii) a $CrO_3$ layer having a thickness in a range of 5 Å to 1000 Å, wherein said conducting material has a sheet conductance higher than $1\times10^{-5}\Omega^{-1}$, e.g., in a range of $10^{-5}\Omega^{-1}$ to $10^{-2}\Omega^{-1}$, and a hole carrier concentration higher than $10^{12}$ cm$^{-2}$, e.g., in a range of $10^{12}$ cm$^{-2}$ to $10^{14}$ cm$^{-2}$.

The invention will now be illustrated by the following non-limiting Examples.

EXAMPLES

Study 1. Boosting Surface Charge-Transfer Doping Efficiency and Robustness of Diamond with $WO_3$ and $ReO_3$ Disclosed herein is the use of $WO_3$ and $ReO_3$ as direct surface electron acceptor layers for the TD of the diamond:H surface. $WO_3$ TD is found to yield a p-type conductive surface layer at a close diamond:H interface proximity with electrical properties significantly superior to those induced by other materials reported so far (FIG. 1). The areal hole density at room temperature vs. thickness coverage, as measured by Hall effects, is found to reach a record value of up to $2.52\times10^{14}$ cm$^{-2}$ at the very first monolayers of coverage (from 1.2 nm to 4.8 nm) for $WO_3$. For $ReO_3$, a value in the range of $2.87$-$3.63\times10^{13}$ cm$^{-2}$ is shown for the different thicknesses. Hall effect measurements as a function of temperature for diamond:H/$ReO_3$ layers show an impressive electrical stability of up to at least 450° C., while diamond:H/$WO_3$ loses its high electrical performance after 300° C.

In charge-exchange complexes, work function is crucial for determining the energetic requirements of transferring electrons from a solid until electrodynamic equilibrium. Therefore, transition-metal oxides (TMOs) are attracting considerable interest due to their low-lying conduction band and/or high work functions. Besides having different lattice constants and crystallinity structures, the electronic properties of TMOs differ mainly by their sensitivity to oxygen deficiency, which translates to the degradation of work function values and hence to the stability of their charge transfer properties. In the present case, work functions of $WO_3$ ($\varphi$=6.7 eV) (Gerling et al., 2015) and $ReO_3$ ($\varphi$=6.7-6.8 eV) (Yoo et al., 2014; Suchitra et al., 2014) are very close to each other and to the aforementioned TMOs; thus, one would have expected to see similar results. However, in practice, diamond:H surface conductivity with the present oxides shows substantially different electrical characteristics and performances, suggesting additional factors (i.e., beside work function value) influencing the charge-exchange efficiency at the host/acceptor interlayer (FIG. 1).

The dependence of changes in the electrical and surface properties changes with the thickness of the deposited $WO_3$ and $ReO_3$ layers on diamond:H is investigated by carrying out a combination of Hall effect surface conductivity with C1s core level and corresponding Re(4f) and W(4f) spectra XPS measurements.

Diamond:H samples were coated with thermally evaporated $WO_3$ and $ReO_3$ with thicknesses ranging from 5 Å to 100 Å, after in-situ heating at 350° C., in order to prudently remove any humid-air-related adsorbates and exclude their eventual contribution to conductivity (see Experimental section). The electrical properties of all samples were measured by the Hall effect in a Van der Pauw configuration as described elsewhere (Yom-Tov et al., 2010). FIG. 1 shows a comparison of the areal hole density and conductance values for different transition-metal oxide surface acceptor layers inducing TD of diamond:H vs. their incremental layer thicknesses, all prepared and measured under identical conditions. A diamond:H TD induced with $H_2O$ from the air exposed is also presented in FIG. 1 for direct comparison. The data clearly demonstrate superior electrical properties obtained for $WO_3$ layers evaporated onto diamond:H at the first monolayers of coverage with areal hole concentration values ranging from $2.52\times10^{14}$ cm$^{-2}$ to $1.3\times10^{14}$ cm$^{-2}$, corresponding to thicknesses from 1.2 nm to 4.8 nm. Diamond:H/$ReO_3$ keeps constant the values of sheet hole density in a narrow range of $3.63\times10^{13}$ cm$^{-2}$ to $2.4\times10^{13}$ cm$^{-2}$.

Since the formed 2DHG depth at the diamond:H subsurface will govern the available amount of carrier concentrations measured at the surface, we define a TD efficiency coefficient $\eta$ as: $\eta=100\times(E_F-E_{VBM})$/Thickness, corresponding to the band bending depth value, $E_F-E_{VBM}$ (extracted from XPS measurement, FIG. 3b) divided by the surface electron acceptor thickness. The inset of FIG. 1 shows the thus defined efficiency plotted vs. surface acceptor coverage and depicts how much each surface electron acceptors efficiently induces a deep-lying 2DHG at a given surface coverage thickness.

Figure 2A:
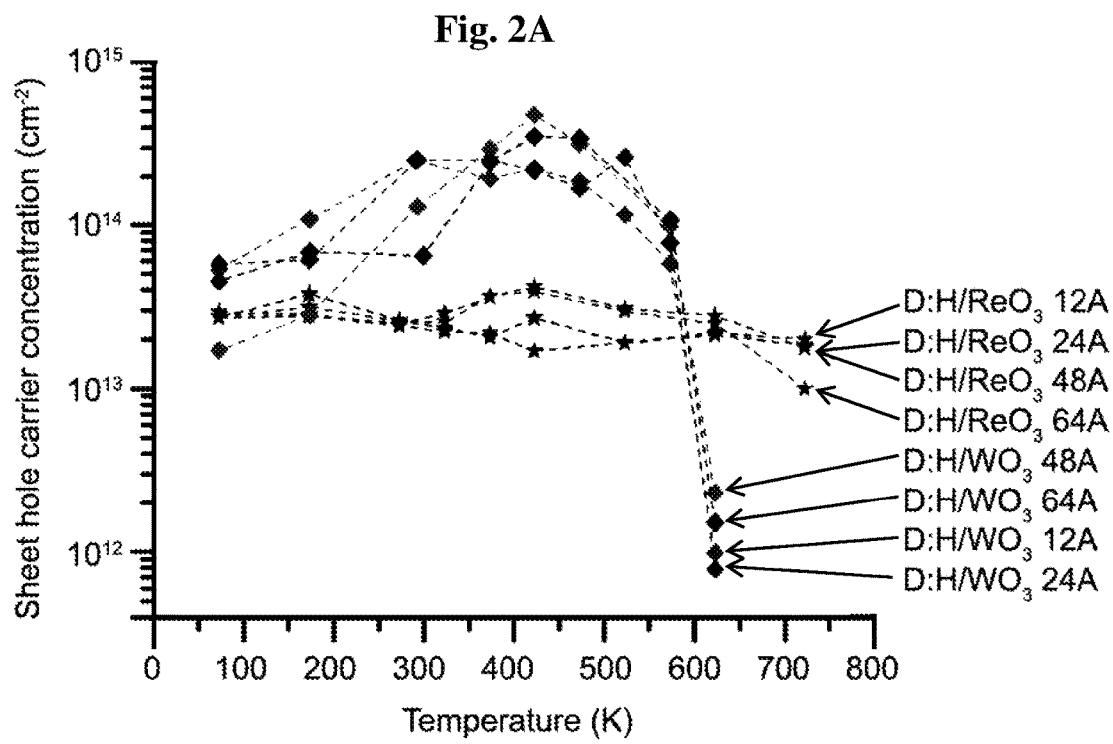
FIGS. 2A-2C show sheet hole carrier concentration (2A); mobility (2B); and conductance (2C) of transfer doped hydrogen terminated diamond samples with $ReO_3$ and $WO_3$ for different thicknesses as function of temperature (K).
Figure 2B:
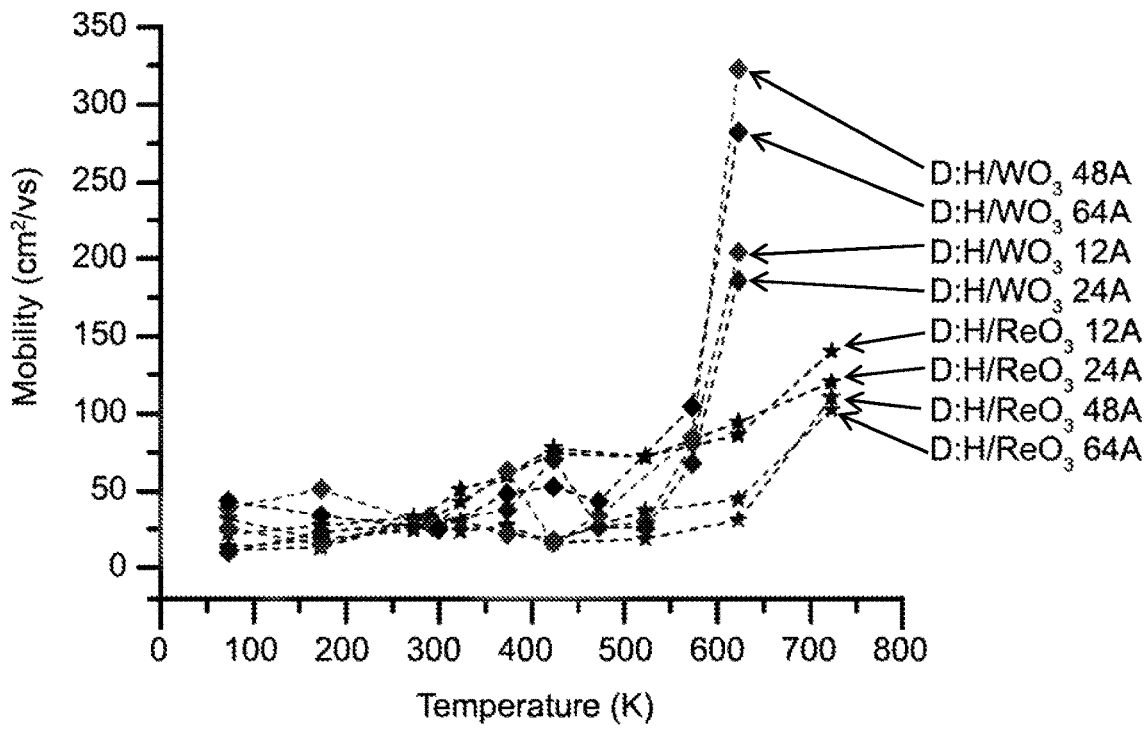
Figure 2C:
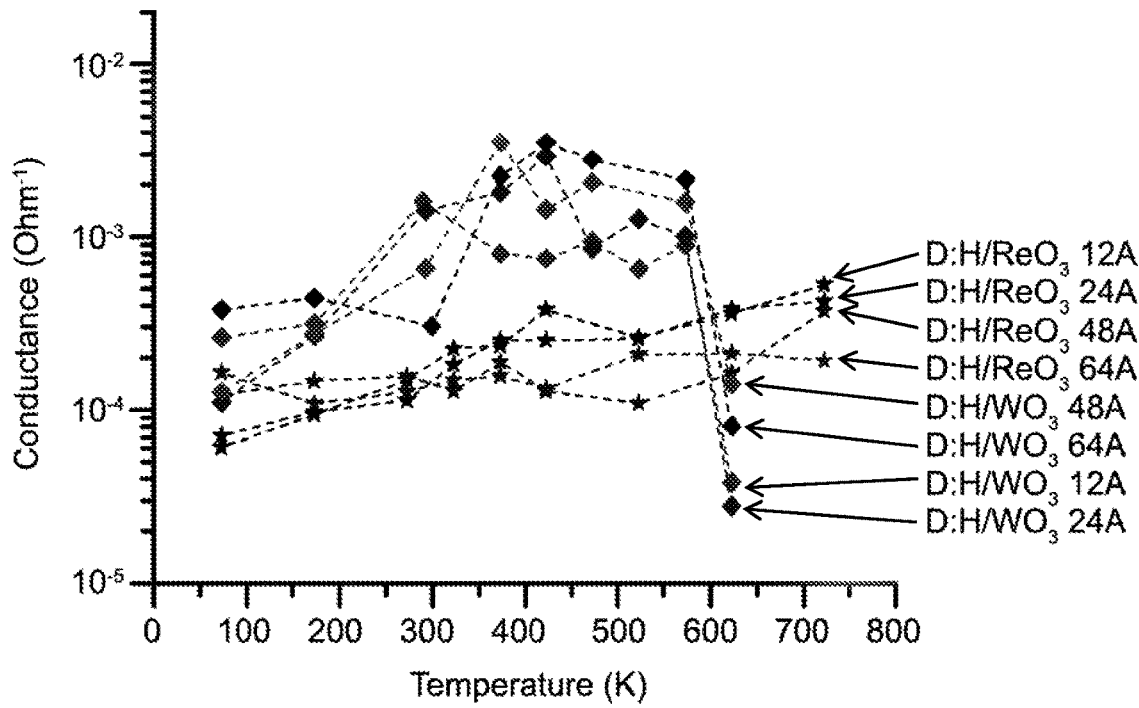

FIGS. 2a-2c show the hole sheet carrier concentration, carrier mobility, and conductance, measured by the Hall effect as a function of temperature between −200° C. to 450° C. (plotted in K) for diamond:H/$WO_3$, and diamond:H/$ReO_3$ samples with thicknesses ranging from 1.2 nm to 6.4 nm. Diamond:H/$WO_3$ samples show an increase in the sheet hole concentration from $1.7$-$5.77\times10^{13}$ cm$^{-2}$ at −200° C. to $2.18$-$4.78\times10^{14}$ cm$^{-2}$ for a temperature up to 150° C., followed by a moderate decrease with a sheet hole concentration from $1.7\times10^{14}$ cm$^{-2}$ to $5.8\times10^{13}$ cm$^{-2}$ for 300° C. and a loss of two orders of magnitude in the carrier concentration when reaching 350° C. In contrast, diamond:H/$ReO_3$ shows an outstanding stability in the sheet hole carrier concentration within a narrow value in the range of $2.55$-$3.12\times10^{13}$ cm$^{-2}$ from −200° C. to 450° C. Hole mobility of diamond:H/$WO_3$ ranges between 20 and 104 cm$^{-2}$V$^{-1}$s$^{-1}$ for temperatures up to 300° C. and increase to a value of 320 cm$^{-2}$V$^{-1}$s$^{-1}$ at 350° C. following the decreasing carrier concentration. Taking into account the relatively high thickness layer and keeping in mind the crystallinity phase formation of $WO_3$ at such temperature, this sharp mobility increase may be tentatively attributed to a carrier transport transition from a quasi-2DHG to an emerging 3D channel structure (i.e., $WO_3$ layer) where the screening of the ionized impurities tends to diminish. Diamond:H/$ReO_3$ samples show a moderate monotonic increase in hole mobility and in resistivity changing from 20 to 140 cm$^{-2}$V$^{-1}$s$^{-1}$ when the temperature is changed from −200° C. to 450° C. A note worth to be added concerning the remarkable conductance value of $1.5\times10^{-3}$ Ohm$^{-1}$ measured for diamond:H/$WO_3$ (1.2-2.4 nm) at room temperature and the value of $2$-$3\times10^{-3}$ Ohm$^{-1}$ for diamond:H/$WO_3$ (4.8-6.4 nm) at 150° C. Surface characterization of chemical bonding and band bending evolution of the diamond:H/$ReO_3$ and diamond:H/$WO_3$ interfaces were determined by XPS measurements of C1s core level spectra of the incremental layer thicknesses. Re(4f) and W(4f) core level spectra were also measured (FIGS. 3c-3d) for characterizing the stoichiometry of the various $ReO_3$ and $WO_3$ layers and analyzing eventual oxygen deficiencies, capable of causing work function modifications.

XPS spectra of Re(4f) (FIG. 3c) show the $Re^{6+}4f_{7/2}$ and $4f_{5/2}$ doublet peaks (with a splitting binding energy (BE) of 2.4 eV $Re^{6+}4f_{5/2}/Re^{6+}4f_{7/2}$ ratio of 3:4) for different thicknesses, at binding energies of 46.1 eV and 48.7 eV, in agreement with previous reports (Yoo et al., 2014). This pair of peaks represents the $Re^{6+}$ oxidation state structure (dotted line) and reveals its predominant presence for different diamond:H/$ReO_3$ films. Similarly, FIG. 3d shows the $W^6+4f_{7/2}$ and $4f_{5/2}$ doublet peaks (with a splitting BE of 2.1 eV and $W^6+4f_{5/2}/W^6+4f_{7/2}$ ratio of 3:4) for different thicknesses, appearing at binding energies of 35.7 eV and 37.8 eV, similar to previous reports (Bertus et al., 2013). Here again, the pair of peaks representing $W^{6+}$ oxidation state (dotted line) is the predominant structure for the incremented different diamond:H/$WO_3$ films. The absence of reduction states in different $ReO_3$ and $WO_3$ layers excludes possible oxygen deficiencies that may be the origin of gap state generation close to the Fermi level and work function degradation. These results are found to be identical before and after electrical measurements.

The C1s core level spectra for both $ReO_3$ and $WO_3$ at different thicknesses were measured by XPS in order to probe the state of the near surface C atoms and to estimate the position of the surface Fermi level ($E_F$) relative to the valence band maximum ($E_{VBM}$). The results of C1s core level peaks with their detailed de-convoluted bonding components for diamond:H covered with $ReO_3$ and $WO_3$ at increasing thicknesses and, as a reference, for a type IIb boron doped diamond:H after annealing at 400° C. (lowest curve) can be found in the Experimental section.

Figure 3A:
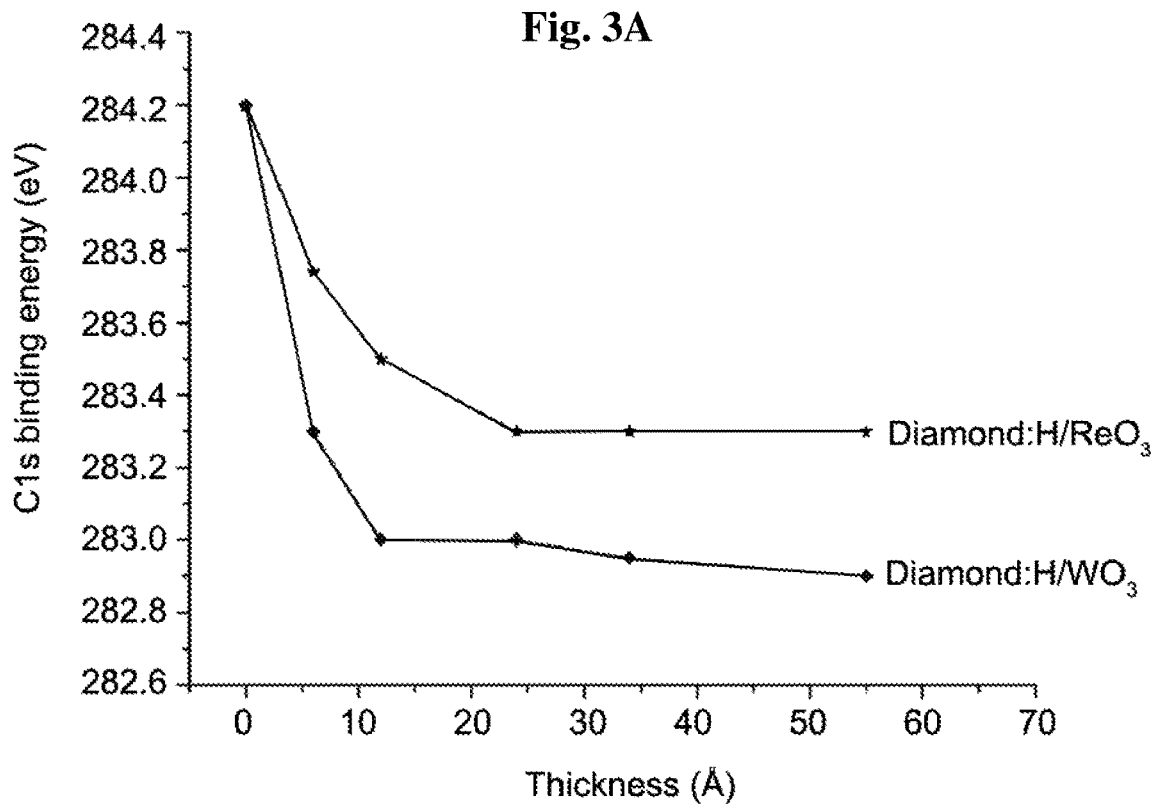
FIGS. 3A-3D show C1s diamond bulk binding energy position as a function of incremental $ReO_3$ and $WO_3$ films thicknesses (6 Å to 45 Å) deposited on hydrogenated diamond (3A); variation of $E_F-E_{VBM}$ values as a function of $ReO_3$ and $WO_3$ thickness coverage derived from XPS measurement of C1s diamond bulk binding energy position (3B); and the Re4f and W4f XPS spectra plots of the respective deposited $ReO_3$ and $WO_3$ film thicknesses showing the $Re^{6+}$ and $W^{6+}$ oxidation state structures represented in dotted lines vs. a continuous line for raw data (3C and 3D, respectively).
Figure 3B:
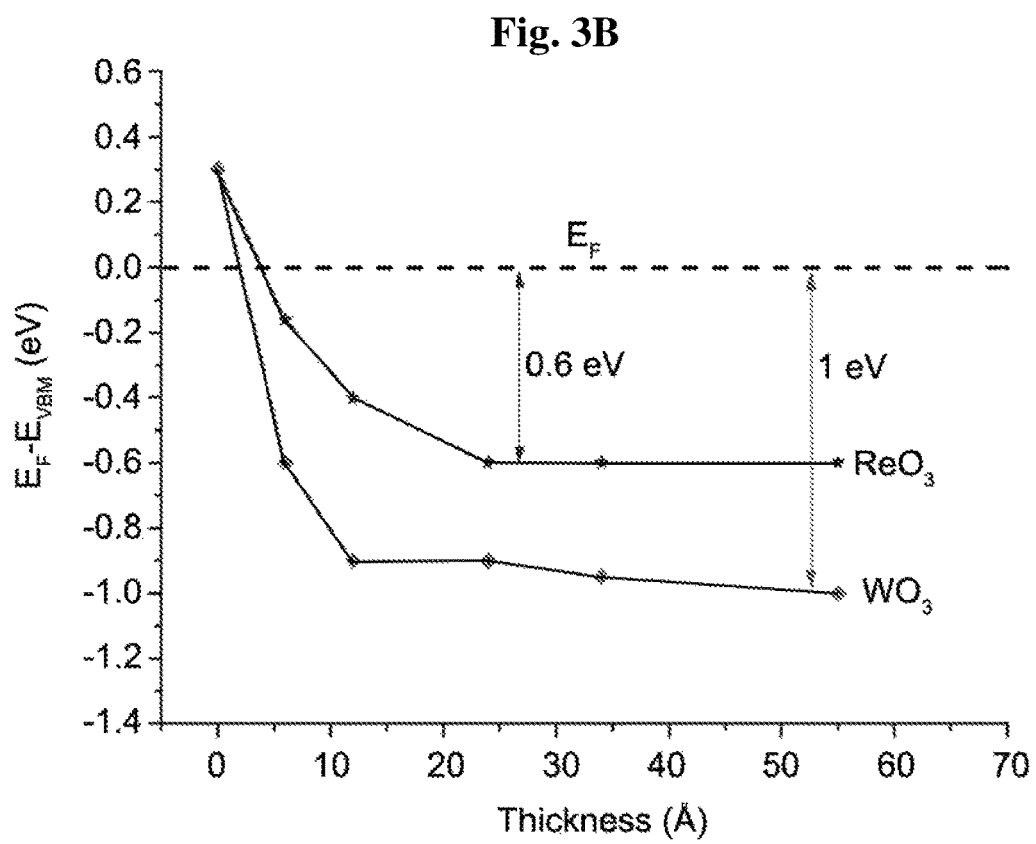
Figure 3C:
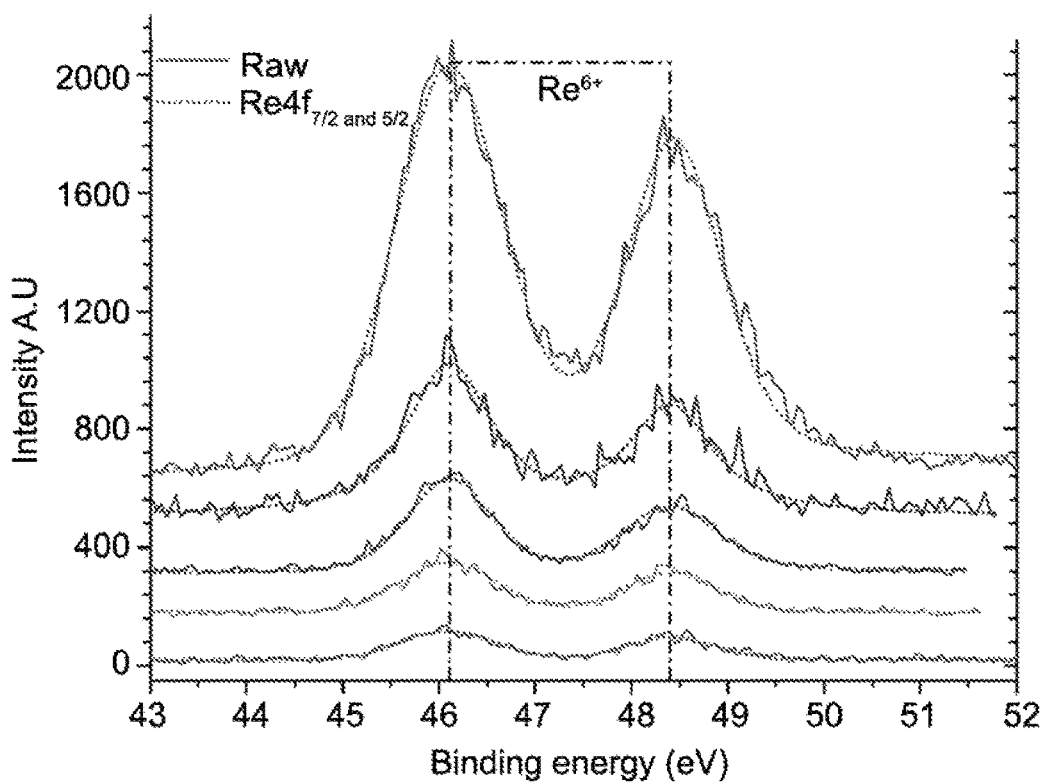
Figure 3D:
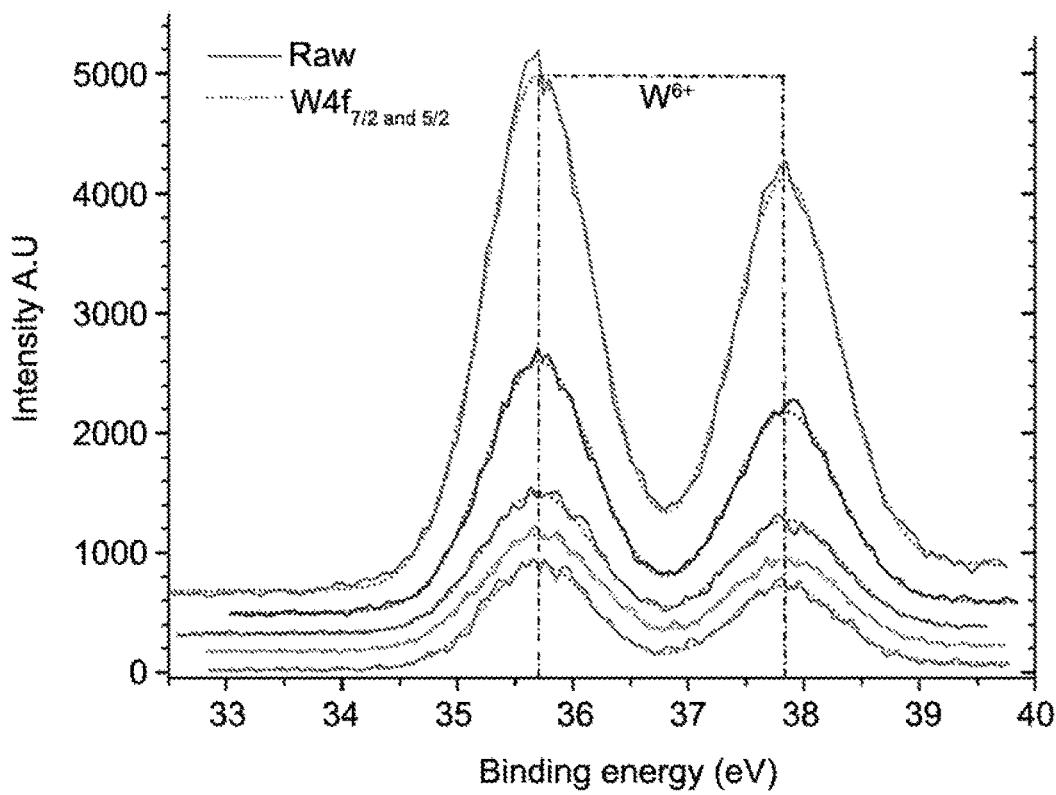

The C1s diamond bulk binding energy position shift as a function of $ReO_3$ and $WO_3$ thickness coverage is shown in FIG. 3a. The band bending (BB) value, $E_F$-$E_{VBM}$ (schematically represented in FIG. 3b), was determined from the energy difference between the diamond bulk peak, extracted from the measured C1s binding energy (FIG. 3a), and the known fixed energy separation of the valence band maximum (VBM) to the C1s core level of 283.9±0.1 eV (Maier et al., 2001). The dependence of $E_F$-$E_{VBM}$ with $ReO_3$ and $WO_3$ thicknesses is shown in FIG. 3b. The $E_{VBM}$ value starts from a position below the bulk Fermi level (0.35 eV), in accord with other reports (Edmonds et al., 2011), and rises rapidly, reaching a maximum of 0.6 and 1 eV above the Fermi level for $ReO_3$ and $WO_3$ thicknesses of 25 Å and 35 Å, respectively, whereupon a saturation is noted.

Figure 4:
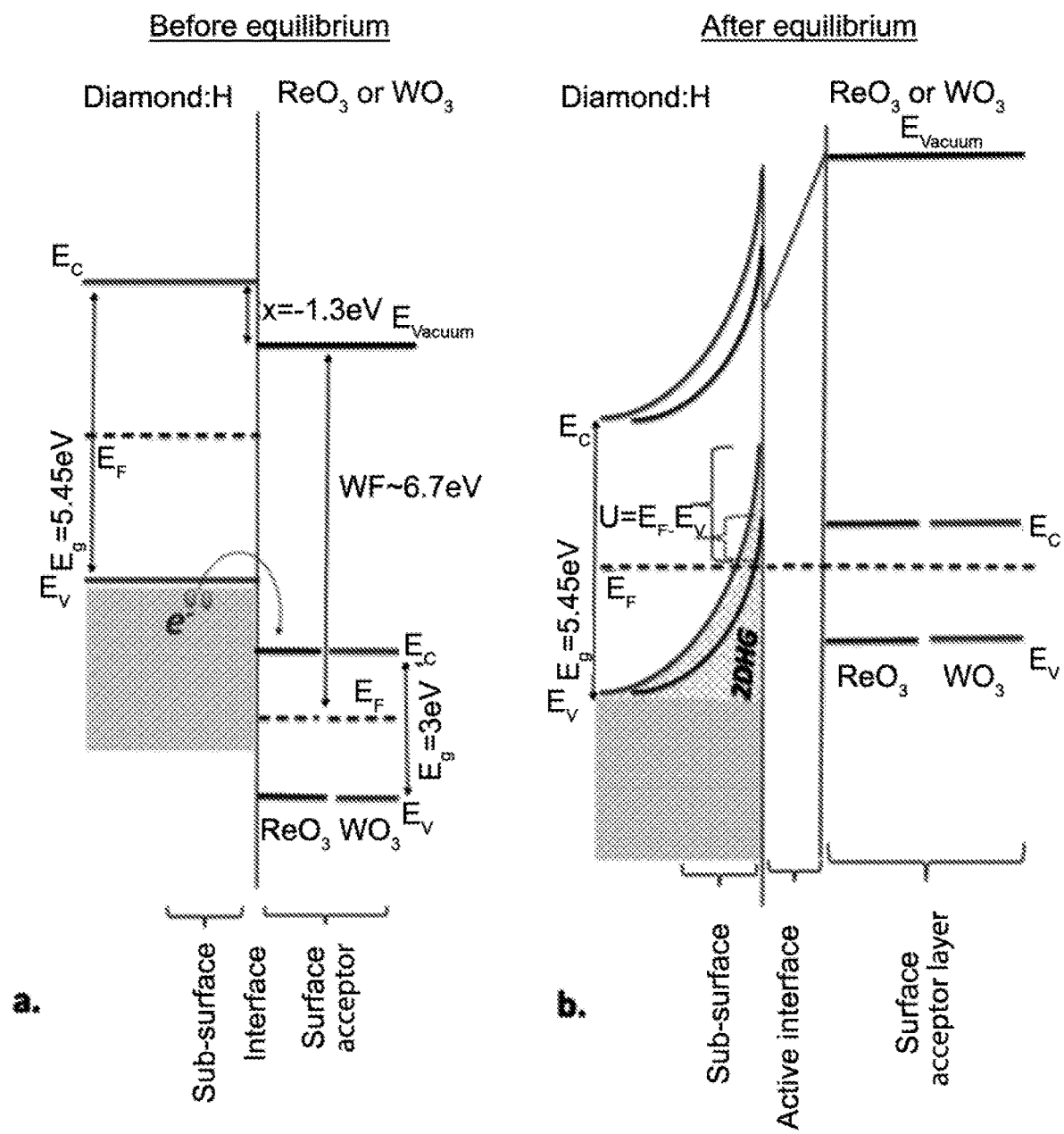
FIG. 4 schematically illustrates the energy-level diagram before charge exchange (left) and after equilibrium (right) of the surface transfer doping of hydrogenated diamond with $ReO_3$ and $WO_3$. A modified 2DHG depth-lying is illustrated following the corresponding band bending values and different transfer-doping efficiency of $ReO_3$ and $WO_3$.

Close to the diamond:H interface (FIG. 1b), the contribution of each TMO surface acceptor's first monolayer (up to 1.2 nm) to the 2DHG formation is very different from each other. $WO_3$ clearly excels in yielding the deeper-lying 2DHG for minimum coverage, followed by $ReO_3$. This same order of superiority is recognized in the carrier concentration values vs. same thicknesses (FIG. 1a) of each respective TMO. This similar trend appearing on both plots and extracted from both techniques ($E_F$-$E_{VBM}$ from XPS vs. carrier concentration from Hall effect) suggests a further confirmation of the present experimental result correlation of the electrical measurement and band bending values. For TMO surface acceptor's thicker thicknesses (>5 nm), carrier concentration values and TD efficiency tend to converge. FIG. 4 shows the presentation of the energy-level diagram before charge exchange (FIG. 4a), and after equilibrium (FIG. 4b) of the surface transfer doping of hydrogenated diamond with $ReO_3$ and $WO_3$. As a result of the transfer of charge, a doping induced interface dipole arises and is expected to behave like an ideal capacitor—this is presented schematically and labeled as the active interface.

Despite the close values of work functions for both surface electron acceptor substances used here ($ReO_3$ and $WO_3$), an unexpected substantial difference in the experimental surface conductivity results for diamond:H/$ReO_3$ and diamond:H/$WO_3$ is recorded (FIG. 2). This electrical behavior is further pronounced by the fact that the oxides give rise to different band bending depths (FIG. 3a) and consequently different 2DHG effective dimensions (FIG. 4). This suggests that the surface TD efficiency of diamond:H is not only affected by the surface acceptor work functions, as it has been accepted so far, but also susceptible to be influenced by additional factors.

TMO crystallinity is temperature dependent and differs from material to material. This temperature dependence will certainly affect the electrical properties of different dopant layers. $ReO_3$ exists in a single phase of primitive cubic structure of cP4 (Greenwood and Earnshaw, 1997). This single and symmetrical unit cell contributes to the stable lattice structure capabilities against eventual reconstruction upon heating. This may fairly explain the higher sustainability of the diamond:H/$ReO_3$ conductive surface up to 450° C. as compared to the case of $V_2O_5$, which also has a single crystalline phase (however, being orthorhombic with an asymmetric unit cell) and has been previously reported to yield a stable surface conductivity of up to 300° C. (Crawford et al., 2016). Oppositely, $WO_3$ has three different crystalline phases—triclinic, monoclinic, and orthorhombic—which spontaneously reorganize, following the temperature range values of −50-17° C., 17-330° C., and 330-740° C., respectively (Lassner and Schubert, 1999). This may explain the three different electrical properties of the diamond:H/$WO_3$ surface we see as function of temperature (FIG. 2a), which exhibits higher conductivity values for the favorable crystalline phase benefitting higher atomic density at the interface coverage (e.g., as seen for monoclinic up to 300° C.). It can therefore be postulated that the highest areal hole concentration of $4.78 \times 10^{14}$ cm$^{-2}$ reported here for the diamond:H/$WO_3$ surface may be associated with the high atomic density structure layer offered by the surface acceptor $WO_3$ monoclinic phase, formed at the interface with diamond:H. An analogous comparison can be done with diamond:H/$MoO_3$ which has been reported to yield an areal hole density of up to $1 \times 10^{14}$ cm$^{-2}$ for the same temperature range, knowing that $MoO_3$ tends to crystallize in the orthorhombic structure of α-phase, which has a relatively lower atomic density structure as compared with the monoclinic one (Di Yao et al., 2012). We therefore propose that the results reported here about the magnitude and the temperature stability of the diamond:H transfer doping with $WO_3$ and $ReO_3$, are influenced by the combined work functions and atomic density structure characteristic of the electron surface acceptor's layers at the diamond:H/TMO's interface.

In summary, a way for obtaining a p-type surface conductivity by transfer doping of hydrogen-terminated diamond with minimal $WO_3$ and $ReO_3$ coverage is reported. The hall effect measurement vs. temperature and core level C1s XPS measurements were used to depict a higher transfer doping efficiency per thickness coverage for the case of diamond:H/$WO_3$. The surface conductivity of diamond:H/$WO_3$ yields a record value of the hole carrier concentration (2.18-4.78×10$^{14}$ cm$^{-2}$) at the very first monolayer coverage (from 1.2 nm), whereas diamond:H/$ReO_3$ surface conductivity is found to be remarkably stable up to 450° C. These findings suggest that TMO's work functions are not the only factor governing the charge-transfer efficiency but may also be influenced by the atomic density structure characteristics of the film at the interface. The present study improves the performances of surface electron acceptors used so far and provides a new advantageous means for realizing electronic devices based on diamond surface conductivity with higher performances.

Experimental

Samples Preparation

Type IIa (100) diamond single crystal samples were used. Surface treatment of the samples include cleaning in boiling acids and hydrogen termination by exposure to pure hydrogen plasma in a CVD reactor at a temperature of about 650° C. for 30 minutes. The samples were then introduced to a vacuum chamber (10$^{-7}$ torr) for $ReO_3$ and $WO_3$ thermal evaporation of various thicknesses from 5 Å to 150 Å. Prior to each deposition, the hydrogenated diamond samples were heated, in situ, to 350° C. during 60 minutes through an underlying heater, to remove hydrocarbon contaminants and to desorb any water adsorbate inducing surface conductivity during ambient exposure. $ReO_3$ and $WO_3$ were separately evaporated in situ from a Knudsen cell onto the sample surfaces at room temperature with a deposition rate of 0.1 nm/min, nominally determined by a quartz crystal microbalance. The deposited $ReO_3$ and $WO_3$ thicknesses values were confirmed by ellipsometry measurements over Si samples references for every deposition batch.

As a verification, a non-hydrogenated diamond, coated with $WO_3$ and $ReO_3$ (25 Å) under similar conditions, has shown a resistance higher than $10^5$ kΩ/Sqr with currents below the detection limit of 100 pA of Hall effect systems for all temperatures. This control clearly proves the absence of parallel conduction contributions from the oxides alone without a previous charge exchange from diamond.

Surface Characterization

Electrical measurements consisting of carrier type, carrier concentration, and mobility were measured as function of temperature, from −200° C. to 450° C., using Hall Effect measurements with magnetic field up to 1.5 T using a Van der Pauw (VdP) contact configuration. Four silver symmetric paint corner-points placed on the top layer of the samples were used for electrical contacts. Hall system data acquisition and analysis algorithm took into account the required 2D sheet geometrical rectification following our standard VdP contacts. This rectification has routinely been calibrated with a reference p-Si with known thickness doped layer before measurements. A further similar reference verification is also done with a Boron doped diamond with known concentration as mentioned elsewhere (Suchitra et al., 2014). Additionally, the same measurements conditions were applied similarly for diamond:H/$H_2O$ (FIG. 5), used as well as reference value. Each data acquisition point values have been received by several round loop measurements and have been extracted as final value within an error rate of less than 10% (error bars in FIG. 5). It should be noted, that the scattering mechanisms involved in the presence of a magnetic field are different, therefore the measured Hall mobility is expected to differ somewhat from the drift mobility.

XPS measurements were used to characterize the chemical bonding and to determine the band structure of the films. These measurements were conducted in a Thermo VG Scientific Sigma Probe system using a monochromatic Al Kα (1486.6 eV) x-ray source in bulk and surface modes. Re4f, W4f and C 1s core levels spectra were collected with pass energy of 20 eV. The spectrometer binding energies (BE) was calibrated by setting the $4f_{7/2}$ core level of Au to 84.0 eV. Curve fitting was done by the XPSPEAK 4.1 software using Voigt functions convolution with a Shirley-type background subtraction.

Figure 5A:
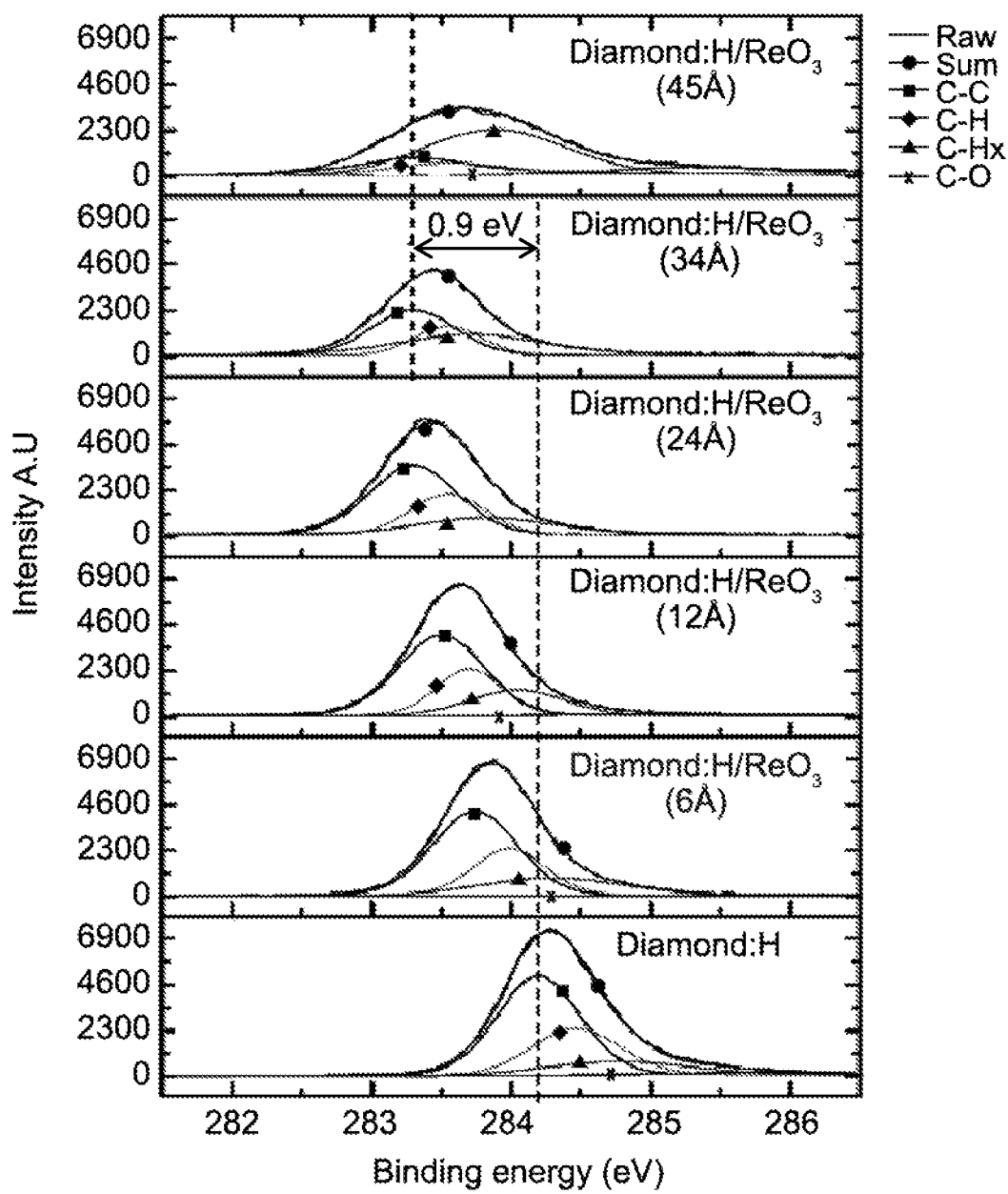
FIGS. 5A-5B show C1s XPS spectra for incremental $ReO_3$ (5A) and $WO_3$ (5B) films thicknesses (6 Å to 45 Å) deposited on hydrogenated diamond. Marked are: C—C bonds from bulk diamond component, the surface component C—H, a surface component contaminant hydrocarbon C—H, carboxyl weak feature C—O, sum of fitted peaks (black dots) and (gray line) experimental data (almost overlapping).
Figure 5B:
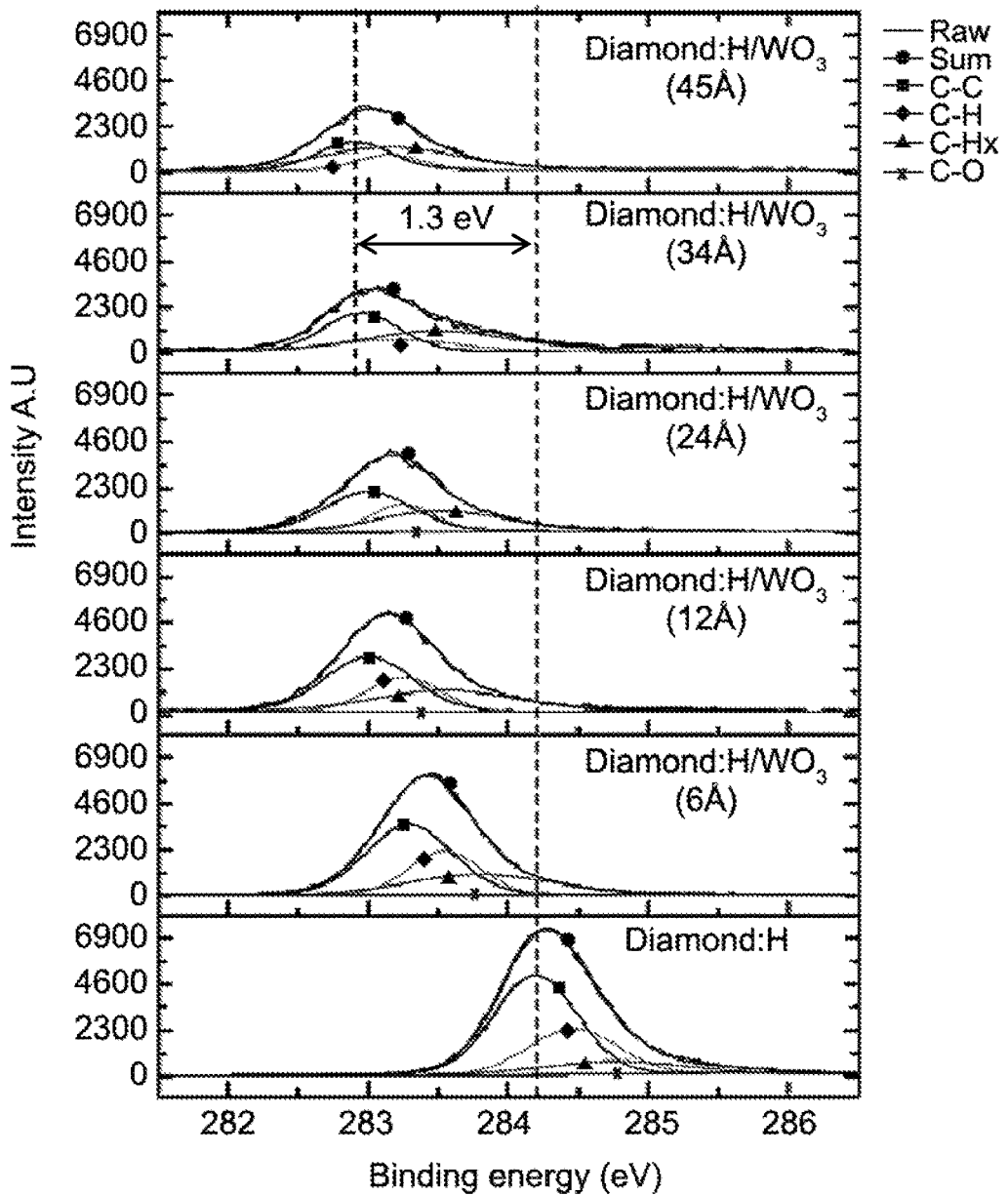

FIG. 5a-5b show the results of C1s core level peaks, with their detailed de-convoluted bonding components for diamond:H covered with $ReO_3$ (3a) and $WO_3$ (3b) at increasing thicknesses and, as a reference, for a type IIb boron doped diamond:H after annealing at 400° C. (lowest curve). The different C1s de-convoluted lines arise from a pure bulk diamond component (blue line) at a binding energy (BE) of 284.2 eV, a surface component C—H (green line) chemically shifted to a higher binding energy by 0.25 eV, hydrocarbon contaminant surface component (C—$H_x$ orange line) shifted to higher binding energies by 0.58 eV, and a weak carboxyl (C—O pink line) feature in agreement with previous work (Russell et al., 2013). The presence of hydrocarbons (C—$H_x$), presumably originating from respective oxide surface contaminants, becomes significant with the increasing coverage. The shift of the diamond bulk peak position with increasing $ReO_3$ thickness indicates a maximum shift of 0.9 eV from the bulk VBM position at about 34 Å. A maximum diamond bulk peak position shift of 1.3 eV is found for the corresponding increasing $WO_3$ thickness.

Study 2. Diamond:H/$WO_3$ Metal-Oxide-Semiconductor Field-Effect Transistor (MOSFET)

The present Study demonstrates the first implementation of a metal-oxide-semiconductor field-effect transistor (MOSFET) utilizing the diamond:H/$WO_3$ system, and investigates the impact of $WO_3$ thickness, gate length and low temperature operation on the device characteristics.

Device Fabrication

Figure 6:
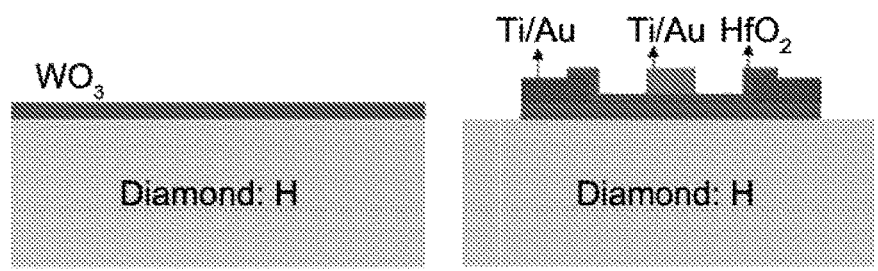
FIG. 6 shows a schematic cross-section of starting heterostructure (left) and p-type diamond:H/$WO_3$ MOSFET (right).

FIG. 6 shows a schematic cross section of the starting heterostructure and the fabricated MOSFET. Three 3×3×0.5 $mm^3$ type IIa (001)-oriented single-crystal diamond substrates supplied from Element6 Ltd., with nitrogen concentration <1 ppm were used. Surface hydrogenation was performed by exposure to pure hydrogen plasma in a CVD reactor at 600° C. for 40 minutes. Subsequently, the samples were heated at 350° C. to desorb $H_2O$ molecules and contaminants from the diamond surface in vacuum (Vardi et al., 2014). This was immediately followed by low-rate (0.1 Å/min) thermal evaporation of different thicknesses (2.4, 3.4 and 4.8 nm) of $WO_3$ in each sample. A surface roughness of Ra 0.6 nm over an area of 1×1 μm was measured by AFM, and a $WO_3$ thickness uniformity of 10% was evaluated by ellipsometry. The stoichiometry and thickness of $WO_3$ was characterized by X-ray photoelectron spectroscopy and ellipsometry and results similar to those shown in Study 1 were obtained.

The process continues with electron-beam evaporation of Ti/Au (20/200 nm), as source and drain electrodes, through a shadow mask. Following this, 20 nm of $HfO_2$ as gate dielectric layer was grown by atomic layer deposition (ALD) at 150° C. The use of a gate oxide was deemed essential to obtain a working FET since $WO_3$ is expected to become highly conductive after the surface transfer process. After that, flowable oxide (FOX) was spin coated on the sample surface and exposed by electron-beam lithography (EBL). This forms a hard mask that is used to define the active channel. Reactive-ion etching based on a $BCl_3$/Cl/Ar chemistry was performed to etch the exposed $HfO_2$ and $WO_3$ and to desorb the Hydrogen from the diamond surface. FOX was then striped with a buffered oxide etchant. Subsequently, a standard photolithographic liftoff step was used to create a Ti/Au (10/100 nm) gate electrode at the center of the channel of the FETs. Devices with gate lengths ($L_g$) ranging from 0.7 to 5 μm and a constant gate width (Wg) of 20 μm were fabricated. The source-drain distance gradually increased from 29 μm to 58 μm as the gate length changed from 0.7 μm to 5 μm.

In this first demonstration, no effort was given to bringing the source and drain ohmic contacts directly onto the D:H surface. Rather, the goal of this work was to demonstrate the viability of the D:H/$WO_3$ as a MOSFET system.

Results

Figure 7A:
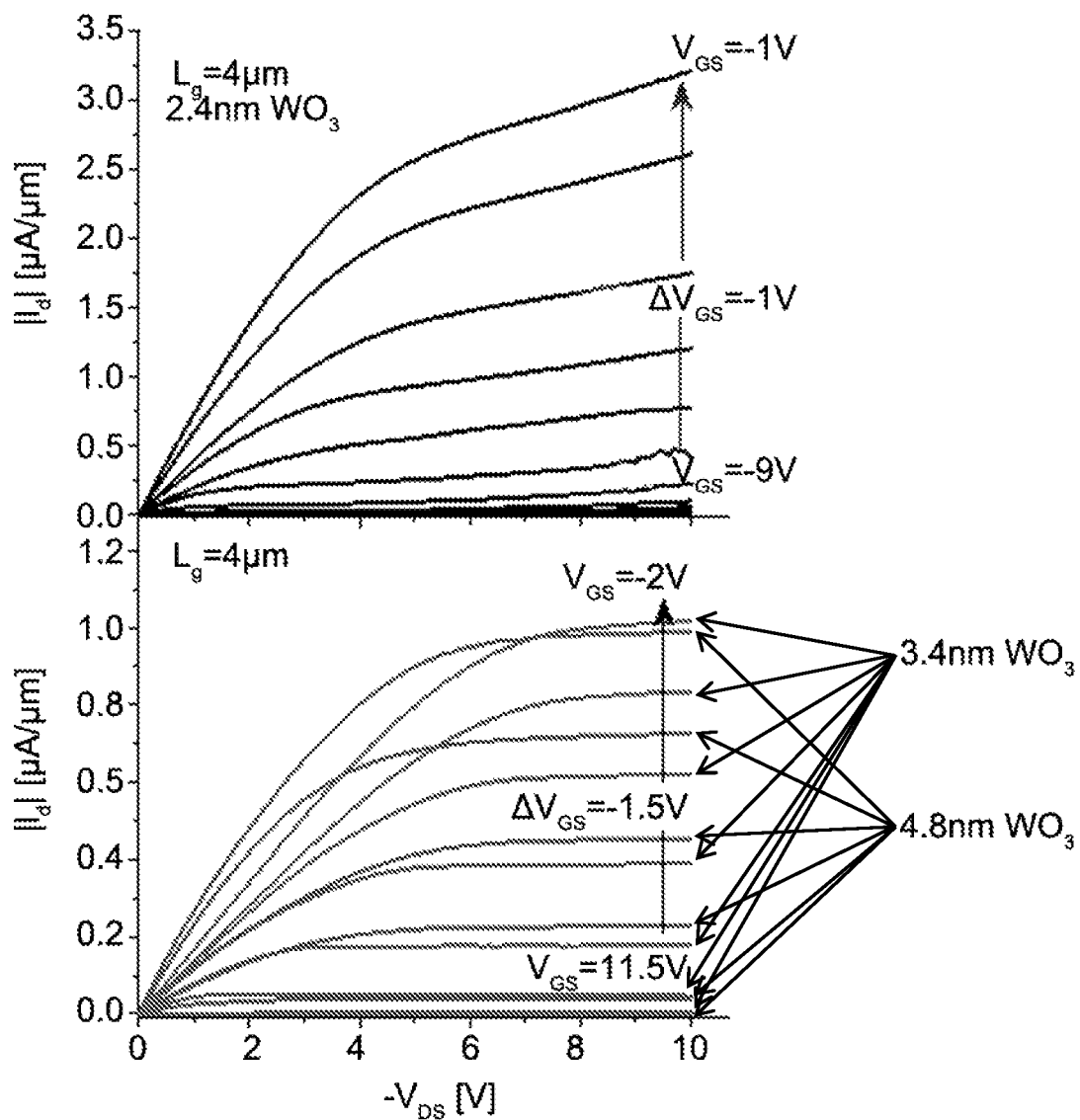
FIGS. 7A-7B show output (7A) and transfer (7B) characteristics for $L_g$=4 diamond:H/$WO_3$ FETs with $WO_3$ thickness ranging from 2.4 nm to 4.8 nm.
Figure 7B:
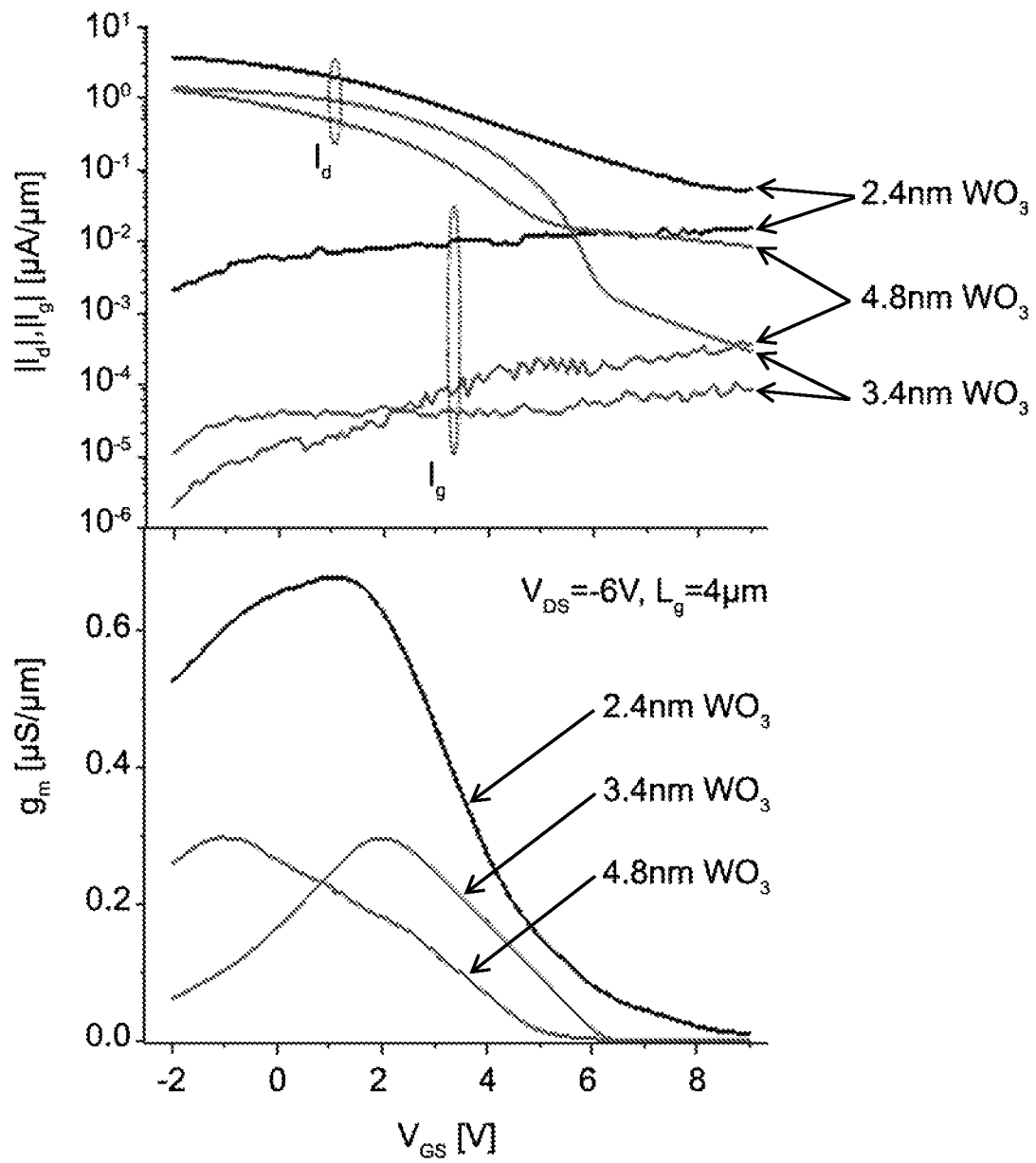

FIG. 7 shows electrical characteristics of typical MOSFETs with $L_g$=4 μm and different $WO_3$ thickness. All devices show well saturated drain current behavior with sharp pinchoff and low output conductance (FIGS. 7A and 7B). The 2.4 nm $WO_3$ MOSFETs show greater drain current, Id, and transconductance, $g_m$ (FIG. 7B), and a more positive threshold voltage, $V_T$. These results are consistent with recent Hall effect observations of decreased surface transfer efficiency and a reduced sheet hole concentration (from $2.5×10^{14}$ $cm^{-2}$ to $1.3×10^{14}$ $cm^{-2}$) of D:H with increasing $WO_3$ thicknesses (from 1.2 nm to 4.8 nm).

The thinner $WO_3$ devices also show greater gate leakage current, $I_g$, (FIG. 7B). This also results in worse drain current saturation (FIGS. 7A and 7B). A more effective electron transfer into the 2.4 nm thick $WO_3$ layer is a plausible explanation for the larger gate current.

Figure 8A:
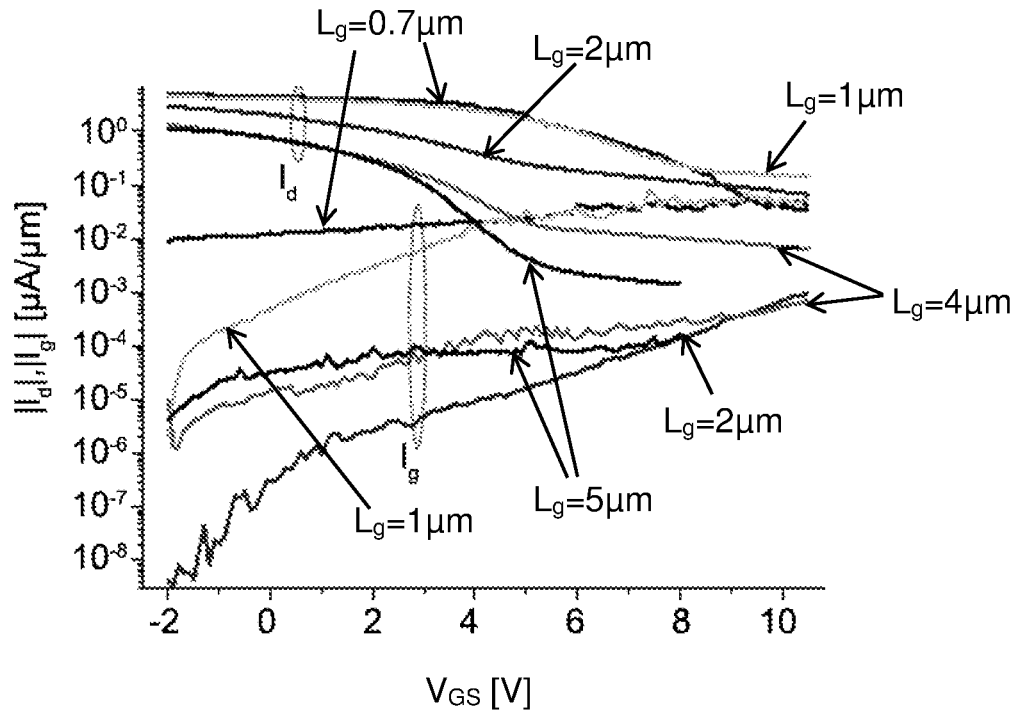
FIGS. 8A-8D show electrical characteristics of 4.8 nm-thick $WO_3$ diamond:H/$WO_3$ FETs with gate width of 20 μm and different gate lengths ranging from 0.7 μm to 5 μm: (8A) subthreshold and gate current characteristics; (8B) $g_m$ characteristics; (8C) maximum $g_m$ ($g_{mmax}$) and maximum drain current ($I_{Dsat}$), all at $V_{DS}$=−6 V; (8D) ON resistance.
Figure 8B:
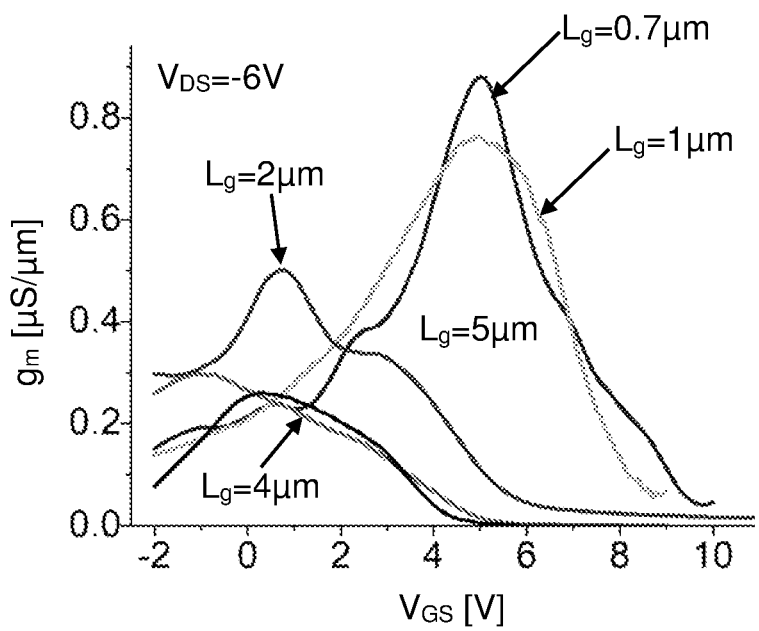
Figure 8C:
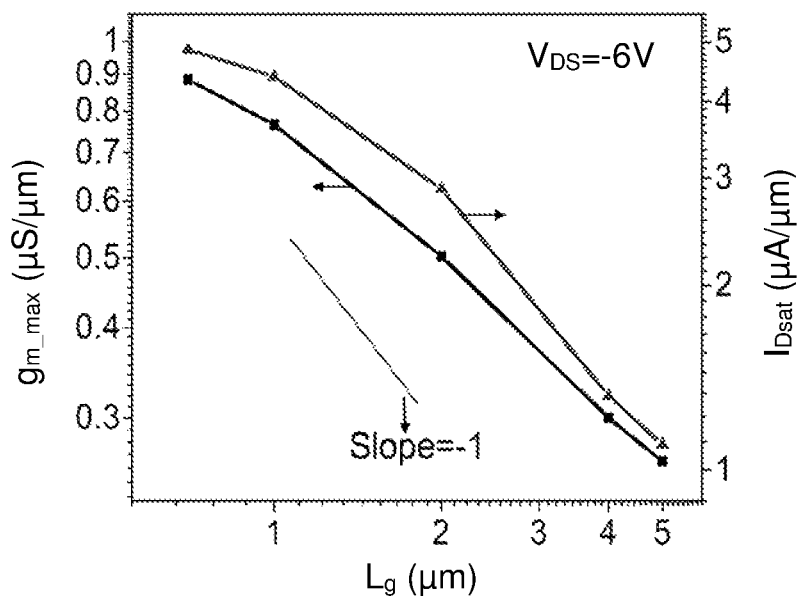

We have studied the impact of gate length, $L_g$, on the electrical characteristics of 4.8 nm-thick $WO_3$ devices. This is graphed in FIG. 8. FIG. 8A shows that the subthreshold behavior rapidly improves as $L_g$ increases. This probably stems from a combination of short-channel effects and reduced $I_g$. In addition, we observe a significant improvement in peak transconductance, $g_{mmax}$, as $L_g$ decreases (FIG. 8B). The threshold voltage, $V_T$, shifts positive as gate length shortens. This could be explained by severe short-channel effects that arise from the use of a relatively thick gate dielectric coupled with the absence of body doping (del Alamo, 2017). FIG. 8C plots $g_{mmax}$ and the maximum drain current, $I_{Dsat}$ as a function of gate length at $V_{DS}$=−6 V. The results indicate both $g_{mmax}$ and $I_{Dsat}$ correlate well with each other and scale in a well-behaved manner with $L_g$.

Figure 8D:
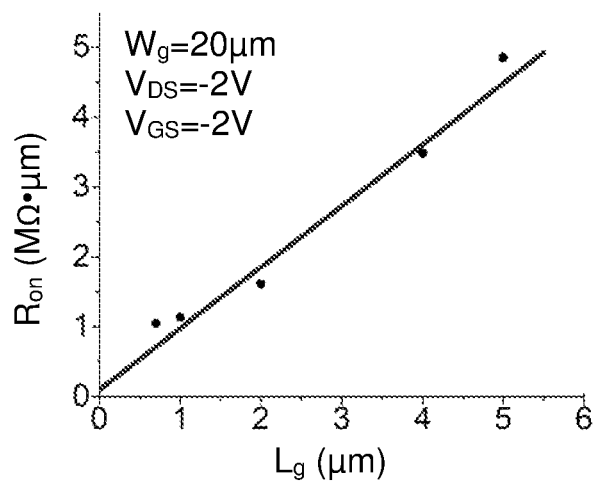

In addition, we extracted the ON resistance of 4.8 nm-thick $WO_3$ transistors with different $L_g$ at VGS=−2 V and $V_{DS}$=−2 V (FIG. 8D). At this VGS, the ON resistance is largely saturated to its minimum value. From extrapolation of these data to $L_g$=0, we estimated a total source/drain access resistance of 197 kΩ·μm.

Figure 9A:
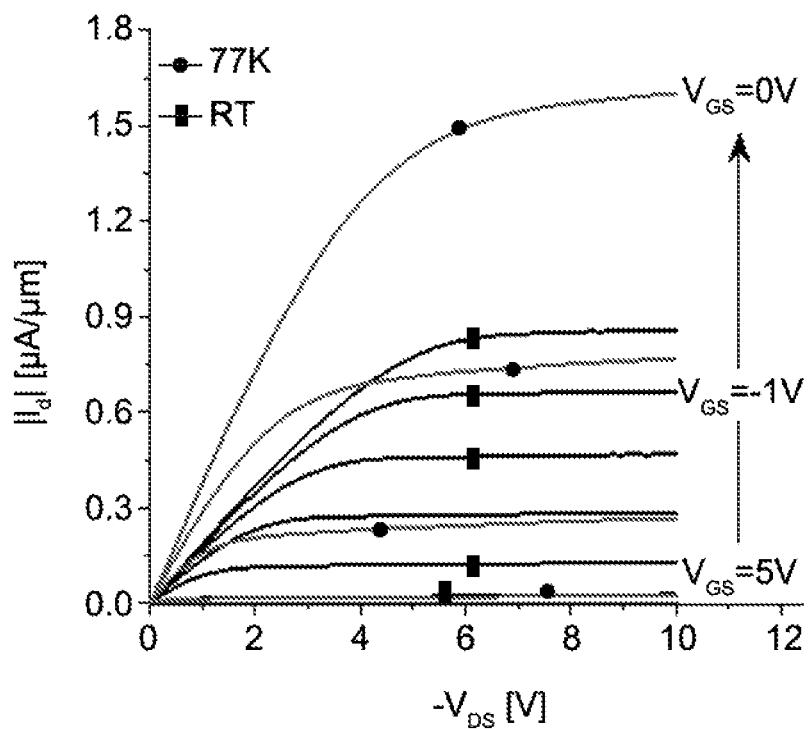
FIGS. 9A-9B show output (9A) and transfer (9B) characteristics for $L_g$=5 μm $WO_{3=4.8}$ nm diamond:H/$WO_3$ FETs measured at 77 K and room temperature (RT).
Figure 9B:
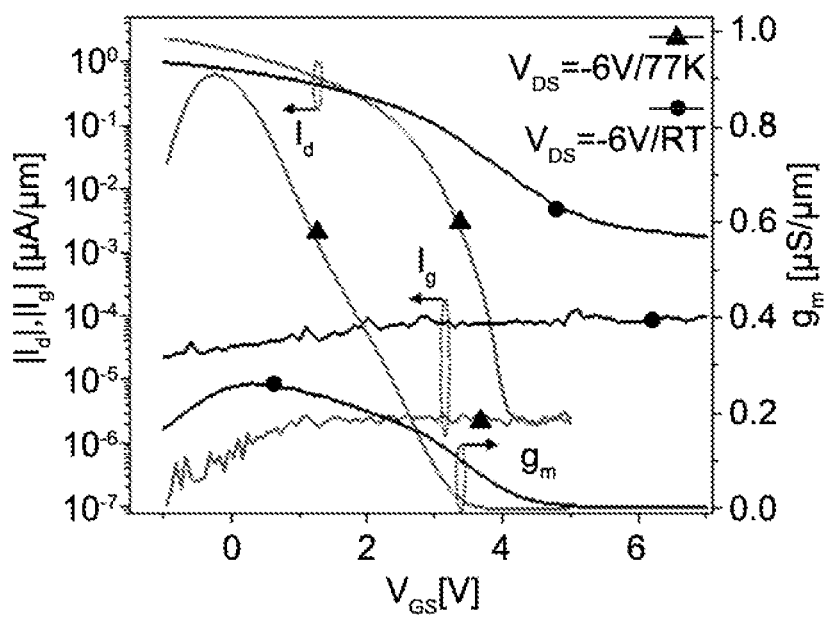

We have also studied the effect of temperature on the electrical characteristics of an $L_g$=5 μm, $WO_{3=4.8}$ nm FET at 77 K. The results are presented in FIG. 9. At 77 K, we observe a large increase in $I_d$ and $g_m$ with $g_{mmax}$ scaling up by 3.5 times. We also see that $I_g$ was reduced by about two orders of magnitude (FIG. 9B). This results in significantly improved subthreshold behavior with the minimum subthreshold swing ($S_{min}$) scaling down from 1225 mV/dec to 190 mV/dec and the ON-OFF ratio improving from ~103 to ~106, as the temperature is reduced from room temperature to 77K.

Figure 10:
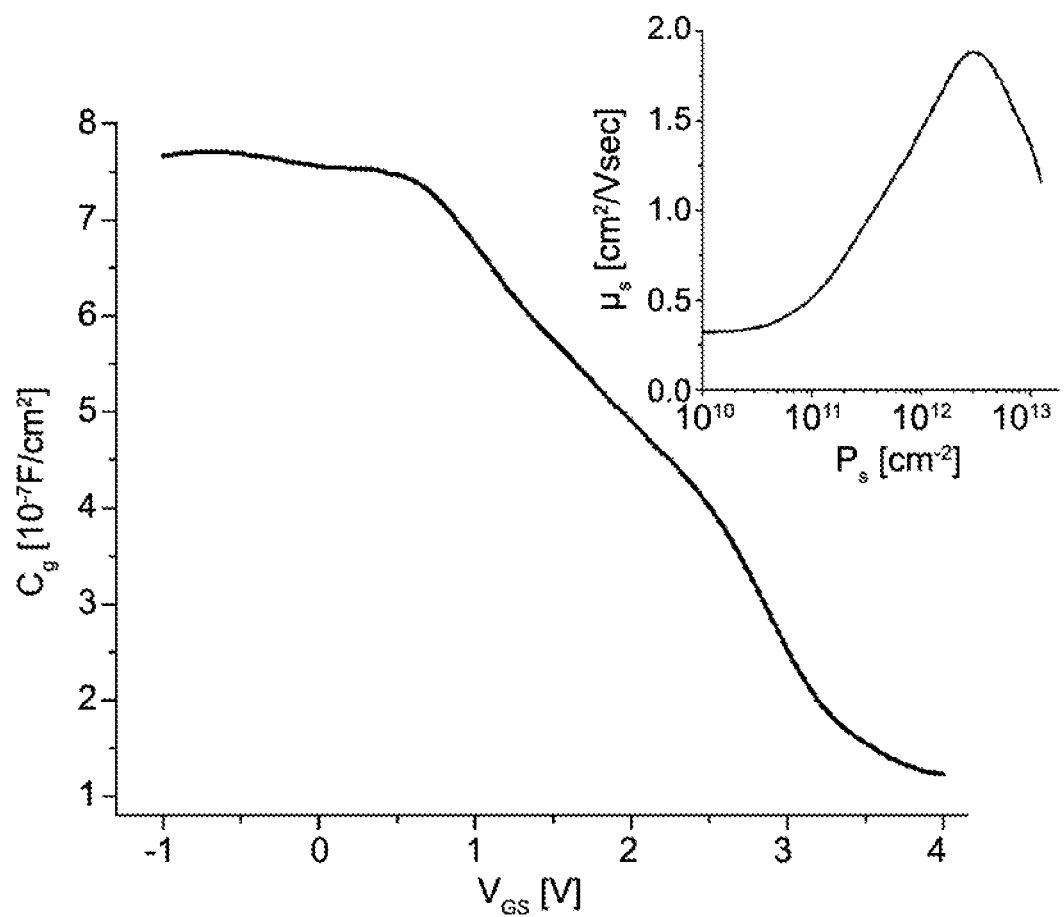
FIG. 10 shows split C-V measurements at 1 MHz of a typical diamond:H/VO3 FET ($L_g$=5 μm, $W_g$=20 μm, $WO_3$=4.8 nm) at 77 K. Inset: sheet hole mobility vs. sheet hole concentration.

Device operation at 77 K was further studied by carrying out capacitance-voltage ($C_g$—$V_{GS}$) and I-V transfer ($I_d$-$V_{GS}$) characteristics in a device with 4.8 nm of $WO_3$ and $L_g$=5 μm. The C-V characteristics were measured at 1 MHz with $V_{DS}$=0 V. $I_d$-$V_{GS}$ measurements were performed at $V_{DS}$=−2 V. A typical $C_g$-$V_{GS}$ result is shown in FIG. 10. From these data, we extract the gate voltage dependence of the sheet hole concentration ($p_s$) and hole mobility ($\mu_p$) (Radisavljevic et al., 2011; Balendhran et al., 2013). We also assume that the access resistance does not change with temperature since it is believed to be largely dominated by the contact resistance. We find that, in any case, the extracted mobility exhibits weak sensitivity to the actual value of access resistance that was used.

The inset of FIG. 10 graphs the sheet hole mobility (μs) vs. sheet hole concentration ($p_s$). Over most of its range, the mobility increases with hole concentration. This suggests that Coulomb scattering dominates at low temperature. We observe a maximum sheet hole concentration of about $3.1 \times 10^{12}$ cm$^{-2}$, The corresponding mobility, however, is 1.8 cm$^{-2}$/V·sec. This is much lower than results obtained from Hall measurements at room temperature of similar unprocessed samples. This is also consistent with Coulomb scattering that could be due to gap states introduced as a result of $WO_{3-x}$ reduction during the device fabrication process (Greiner et al., 2012). The reduction in resistance that is observed as the temperature drops could be due to an insulator-to-metal transport transition recently reported by Mattoni et al. in $WO_{3-x}$ (Mattoni et al., 2017). This would also result in a reduced work function and degraded surface transfer doping efficiency at room temperature (Greiner et al., 2012).

The results of this Study reveal the potential of the D:H/$WO_3$ system for future transistor applications but also illustrate the challenge of maintaining high TMO quality during device fabrication, an issue already noted in Vardi et al. (2014). To exploit the advantageous properties of the D:H/TMO system, transistor fabrication processes will need to be developed that maintain the integrity of the TMO layer.

REFERENCES

Balendhran, S., Deng, J., Ou, J. Z., Walia, S., Scott, J., Tang, J., Wang, K. L., Field, M. R., Russo, S., Zhuiykov, S., Strano, M. S., Medhekar, N., Sriram, S., Strano, M. S., Bhaskaran, M., *Adv. Mater.*, 2013, 25(1), 109-114

Bertus, L. M., Faure, C., Danine, A., Labrugere, C., Campet, G., Rougier, A., Duta, A., *Mater. Chem.* Phys., 2013, 140, 49

Chakrapani, V., Angus, J. C., Anderson, A. B., Wolter, S. D., Stoner, B. R., Sumanasekera, G. U., *Science*, 2007, 318, 1424

Christiaens, P., Vermeeren, V., Wenmackers, S., Daenen, M., Haenen, K., Nesladek, M., vandeVen, M., Ameloot, M., Michiels, L., Wagner, P., *Biosens. Bioelectron.*, 2006, 22, 170

Crawford, K. G., Cao, L., Qi, D. C., Tallaire, A., Limiti, E., Verona, C., Wee, A. T. S., Moran, D. A. J., *Appl. Phys. Lett.*, 2016, 108(4), 042103

Dankerl, M., Lipert, A., Briner, S., Stutzel, E. U., Stutzmann, M., Garrido, J. A., *Phys. Rev. Lett.*, 2011, 106, 16884

Daicho, A., Saito, T., Kurihara, S., Hiraiwa, A., Kawarada, H., *J. Appl. Phys.*, 2014, 115, 223711 del Alamo, J. A., *Integrated Microelectronic Devices: Physics and Modeling*, 1st ed. London, U.K.: Pearson, 2017, sec. 10.2.

Edmonds, M. T., Pakes, C. I., Mammadov, S., Zhang, W., Tadich, A., Ristein, J., Ley, L., *Phys. Status Solidi A*, 2011, 208(9), 2062

Geisler, M., Hugel, T., *Adv. Mater.*, 2010, 22, 398

Gerling, L. G., Mahato, S., Voz, C., Alcubilla, R., Puigdollers, J., *Appl. Sci.*, 2015, 5(4), 695

Greenwood, N. N., Earnshaw, A., *Chemistry of the Elements (2nd ed)*. (Butterworth-Heinemann, 1997)

Greiner, M. T., Chai, L., Helander, M. G., Tang, W. M., Lu, Z. H., *Adv. Funct. Mater.*, 2012, 22(21), 4557-4568

Irfan, I., Turinske, A. J., Bao, Z. N., Gao, Y. L., *Appl. Phys. Lett.*, 2012, 101(9), 093305

Imura, M., Banal, R. G., Liao, M., Liu, J., Aizawa, T., Tanaka, H. I. A., Mano, T., Koide, Y., *J. Appl. Phys.*, 2017, 121, 025702

Kalish, R., *J. Phys. D: Appl. Phys.*, 2007, 40, 6467

Kasu, M., Ueda, K., Ye, H., Yamauchi, Y., Sasaki, S., Makimoto, T., *Electron. Lett.*, 2005, 41(22), 1248

Kasu, M., Ueda, K., Yamauchi, Y., Tallaire, A., Makimoto, T., *Diamond Related Mater.*, 2007, 16(4-7), 1010

Kawarada, H., *Appl. Phys. Lett.*, 2014, 105(1), 13510

Laikhtman, A., Lafosse, A., Le Coata, Y., Azriaa, R., Hoffman, A., Surface *Science*, 2004, 551, 99

Landstrass, M. I., Ravi, K. V., *App. Phys. Lett.*, 1989, 55(14), 1391

Lassner, E., Schubert, W. D., *Tungsten: Properties, Chemistry, Technology of the Element, Alloys, and Chemical Compounds*. (Kluwer Academic, New York, 1999)

Lud, S. Q., Steenackers, M., Jordan, R., Bruno, P., Gruen, D. M., Feulner, P., Garrido, J. A., Stutzmann, M., *J. Am. Chem. Soc.,* 2006, 128, 16884

Maier, F., Riedel, M., Mantel, B., Ristein, J., Ley, L., *Phys. Rev. Lett.,* 2000, 85(16), 3472

Maier, F., Ristein, J., Ley, L., *Phys. Rev. B,* 2001, 64, 165411

Mattoni, G., Filippetti, A., Manca, N., Zubko, P., Caviglia, A. D., Charge doping and large lattice expansion in oxygendeficient heteroepitaxial $WO_3$, 2017, Available: https://arxiv.org/abs/1711.05106

Umezawa, H., Tsugawa, K., Yamanaka, S., Takeuchi, D., Okushi, H., Kawarada, H., *Jpn. J Appl. Phys.* Part 2, 1999, 38 (L1222)

Suchitra, Pan, J., Waghmare, U. V., *J Appl. Phys.,* 2014, 116(3), 034304

Poh, W. C., Loh, K. P., De Zhang, W., Triparthy, S., *Langmuir,* 2004, 20(13), 5484

Qi, D., Chen, W., Gao, X., Wang, L., Chen, S., Loh, K. P., Wee, A. T. S., *J. Am. Chem. Soc.,* 2007, 129, 8084

Radisavljevic, B., Radenovic, A., Brivio, J., Giacometti, V., Kis, A., *Nature Nanotechnol.,* 2011, 6(3), 147-150

Russell, S. A. O., Cao, L., Qi, D., Tallaire, A., Crawford, K. G., Wee, A. T. S., Moran, D. A. J., *Appl. Phys. Lett.,* 2013, 103, 202112

Sato, H., Kasu, M., *ibid,* 2013, 31, 47

Sauerer, C., Ertl, F., Nebel, C. E., Stutzmann, M., Bergonzo, P., Williams, O. A., Jackman, R. A., *Phys. Status Solidi A,* 2001, 186(2), 241

Strobel, P., Riedel, M., Ristein, J., Ley, L., *Nature,* 2004, 430, 439

Strobel, P., Ristein, J., Ley, L., Seppelt, K., Goldt, I. V., Boltalina, O., *Diamond Relat. Mater.,* 2006, 15, 720

Sussmann, R. S., *CVD diamond for Electronic Devices.* (John Wiley & Sons, Chichester, 2009).

Taniuchi, H., Umezawa, H., Arima, T., Tachiki, M., Kawarada, H., *Electron Device Lett.,* 2001, 22(8), 390

Tordjman, M., Saguy, C., Bolker, A., Kalish, R., *Adv. Mater. Interfaces,* 2014, 1, 1300155

Vardi, A., Tordjman, M., del Alamo, J. A., Kalish, R., *IEEE Electron Device Lett.,* 2014, 35(12), 1320-1322

Verona, C., Ciccognani, W., Colangeli, S., Limiti, E., Marinelli, M., Verona-Rinati, G., *J. Appl. Phys.,* 2016, 120(2), 025104

Wade, T., Geis, M. W., Fedynyshyna, T. H., Vitalea, S. A., Varghesea, J. O., Lennona, D. M., Nemanichc, R. J., Grotjohnb, T. A., Hollis, M. A., *Diam. Rel. Mat.,* 2017, 76, 79

Yang, W., Auciello, O., Butler, J. E., Cai, W., Carlisle, J. A., Gerbi, J. E., Gruen, D. M., Knickerbocker, T., Lasseter, T. L., Russell, J. N., Smith, Jr. L. M., Hamers, R. J., *Nat. Mater.,* 2002, 1, 253

Di Yao, D., Ou, J. Z., Latham, K., Zhuiykov, S., O'Mullane, A. P., Kalantar-zadeh, K., *Cryst. Growth & Des.,* 2012, 12(4), 1865

Yom-Tov, N., Saguy, C., Bolker, A., Kalish, R., Yaish, Y. E., *J. Appl. Phys.,* 2010, 108, 043711

Yoo, S. J., Chang, J. H., Lee, J. H., Moon, C. K., Wu, C. I., Kim, J. J., *Sci. Rep.,* 2014, 4, 3902

What is claimed is:

1. A conducting material comprising a carbon-based material selected from a diamond or insulating diamond-like carbon, having a hydrogen-terminated surface and a layer of rhenium trioxide ($ReO_3$) coating said hydrogen-terminated surface.

2. The conducting material of claim 1, wherein said diamond is polycrystalline diamond, nanocrystalline diamond, ultra-nanocrystalline diamond, or single diamond.

3. The conducting material of claim 1, wherein said rhenium trioxide layer is a single- or multi-layer of rhenium trioxide having a thickness in a range of 5 Å to 1000 Å.

4. The conducting material of claim 1, wherein said carbon-based material is diamond and the thickness of said rhenium trioxide layer is in a range of 5 Å to 1000 Å.

5. The conducting material of claim 4, having (i) an electrical stability of up to at least 450° C.; or (ii) a sheet conductance higher than $10^{-5}\Omega^{-1}$, and a hole carrier concentration higher than $10^{12}$ $cm^{-2}$.

6. The conducting material of claim 5, having a sheet conductance in a range of $10^{-5}\Omega^{-1}$ to $10^{-2}\Omega^{-1}$, and a hole carrier concentration in a range of $10^{12}$ $cm^{-2}$ to $10^{14}$ $cm^{-2}$.

7. An electronic component comprising a conducting material according to claim 1.

8. An electrode comprising a conducting material according to claim 1.

9. The electrode of claim 8, comprising said conducting material as a conductive layer.

10. A sensor comprising a conducting material according to claim 1.

11. In a method for detection of a chemical or biological material using a sensor, the improvement wherein said sensor comprises a conducting material according to claim 1.

12. A diode comprising a conducting material according to claim 1.

13. The diode of claim 12, comprising a p-n junction, a p-n-p heterojunction or n-p-n heterojunction, wherein one or more of the p-type layers comprises said conducting material and/or said conducting material bridges said p-n junction, p-n-p heterojunction or n-p-n heterojunction; or configured as a schottky diode.

14. A field effect transistor (FET) comprising a conductive material according to claim 1, as either a conductive layer or a p-type layer.

15. The FET of claim 14, constructed as a high-frequency high power FET.

16. A field emission electron source comprising a conductive material according to claim 1.

* * * * *